(12) United States Patent
Wu et al.

(10) Patent No.: US 10,879,306 B2
(45) Date of Patent: Dec. 29, 2020

(54) MICRO SEMICONDUCTOR STRUCTURE

(71) Applicant: PlayNitride Display Co., Ltd., Zhunan Township (TW)

(72) Inventors: Chih-Ling Wu, Zhunan Township (TW); Ying-Tsang Liu, Zhunan Township (TW); Pei-Hsin Chen, Zhunan Township (TW); Yi-Chun Shih, Zhunan Township (TW); Yi-Ching Chen, Zhunan Township (TW); Yu-Chu Li, Zhunan Township (TW); Huan-Pu Chang, Zhunan Township (TW); Yu-Yun Lo, Zhunan Township (TW); Yi-Min Su, Zhunan Township (TW); Tzu-Yang Lin, Zhunan Township (TW); Yu-Hung Lai, Zhunan Township (TW)

(73) Assignee: PLAYNITRIDE DISPLAY CO., LTD., Zhunan Township (TW)

( * ) Notice: Subject to any disclaimer, the term of this patent is extended or adjusted under 35 U.S.C. 154(b) by 0 days.

(21) Appl. No.: 16/434,786

(22) Filed: Jun. 7, 2019

(65) Prior Publication Data
US 2020/0176508 A1 Jun. 4, 2020

(30) Foreign Application Priority Data
Dec. 4, 2018 (TW) .............................. 107143455 A

(51) Int. Cl.
*H01L 27/15* (2006.01)
*H01L 33/36* (2010.01)

(52) U.S. Cl.
CPC ............ *H01L 27/156* (2013.01); *H01L 33/36* (2013.01)

(58) Field of Classification Search
CPC ....... H01L 27/156; H01L 33/36; H01L 27/15; H01L 25/0753
See application file for complete search history.

(56) References Cited

U.S. PATENT DOCUMENTS

2020/0028028 A1* 1/2020 Tsai ........................ H01L 33/62

OTHER PUBLICATIONS

Zhenghao Gan, Changzheng Wang and Zhong Chen, "Material Structure and Mechanical Properties of Silicon Nitride and Silicon Oxynitride Thin Films Deposited by Plasma Enhanced Chemical Vapor Deposition", Published: Aug. 30, 2018, MDPI.*

* cited by examiner

*Primary Examiner* — Quoc D Hoang
(74) *Attorney, Agent, or Firm* — Birch, Stewart, Kolasch & Birch, LLP

(57) ABSTRACT

A micro semiconductor structure is provided. The micro semiconductor structure includes a substrate, a plurality of micro semiconductor devices disposed on the substrate, and a first supporting layer disposed between the substrate and the micro semiconductor devices. Each of the micro semiconductor devices has a first electrode and a second electrode disposed on a lower surface of the micro semiconductor devices. The lower surface includes a region, wherein the region is between the first electrode and the second electrode. An orthographic projection of the first supporting layer on the substrate at least overlaps an orthographic projection of a portion of the region on the substrate. The first supporting layer directly contacts the region.

22 Claims, 32 Drawing Sheets

MICRO SEMICONDUCTOR STRUCTURE

CROSS REFERENCE TO RELATED APPLICATIONS

This Application claims priority of Taiwan Patent Application No. 107143455, filed on Dec. 4, 2018, the entirety of which is incorporated by reference herein.

BACKGROUND

Field of the Disclosure

The present disclosure relates to a semiconductor structure, and in particular relates to a micro semiconductor structure.

Description of the Related Art

With the advancements being made in the field of optoelectronic technology, the size of optoelectronic components has gradually evolved toward miniaturization. In recent years, due to breakthroughs in the size of light-emitting diodes (LEDs), micro light-emitting diodes (micro LED) displays in which arrays of light-emitting diodes are arranged in an array have increasingly interested people in the field. A micro LED display is an active micro semiconductor device display, and it is more energy efficient than organic light-emitting diodes (OLED) displays. Furthermore, a micro LED display has better contrast performance than an OLED display, and it is visible under in sunlight. In addition, since micro LED displays use inorganic material, they have better reliability and a longer lifetime than OLED displays.

However, micro LEDs still have some disadvantages. For example, when a high-temperature process (for example, eutectic bonding) is subsequently performed, a pair of electrodes of the micro LED may melt and thereby come into electrical contact with each other, causing a short circuit. In addition, light-emitting diodes are often held by a supporting layer, so that the micro LED can be picked up from the carrier substrate and transferred to the receiving substrate more easily, and the micro LED is consolidated by the supporting layer to ensure that the quality of the micro LED is not affected by other factors when it is transferred. However, after a micro LED is transferred to the receiving substrate, the supporting layer may remain on the micro LED, which can affect the subsequent process, thereby reducing the performance of the micro LED.

Although the existing micro LED has substantially met the requirements, there are still many problems. Therefore, how to improve the existing micro LED has become one of the topics of great concern in the industry.

BRIEF SUMMARY

Some embodiments of the disclosure provide a micro semiconductor structure. The micro semiconductor structure includes a substrate and a plurality of micro semiconductor devices disposed on the substrate. Each of the micro semiconductor devices has a first electrode and a second electrode disposed on a lower surface of the micro semiconductor structure, and the lower surface includes a region. The micro semiconductor structure also includes a plurality of first supporting layers disposed between the substrate and the micro semiconductor devices. An orthographic projection of the first supporting layer on the substrate at least overlaps an orthographic projection of a portion of the region on the substrate. The first supporting layer directly contacts the region.

In some embodiments, the orthographic projection of the first supporting layer on the substrate is located within the orthographic projection of the region on the substrate. In some embodiments, the orthographic projection of the first supporting layer extends outward along the first direction from the orthographic projection of the region to the outside of the orthographic projection of the region. In some embodiments, the orthographic projection of the first supporting layer on the substrate extends outward along the first direction from the orthographic projection of the region to the orthographic projection of the region of the adjacent micro semiconductor device. In some embodiments, in the orthographic projection of the region, the orthographic projections of the adjacent first supporting layers do not contact each other to form a plurality of discontinuous first supporting layers. In some embodiments, in the orthographic projection of the region, the orthographic projections of the adjacent first supporting layers contact each other to form a continuous structure.

In one embodiment, the micro semiconductor structure further includes a plurality of second supporting layers disposed between the substrate and the first supporting layers. In one embodiment, the orthographic projection of the second supporting layer on the substrate is located within the orthographic projection of the region. In one embodiment, the orthographic projection of the second supporting layer extends outward from the orthographic projection of the region along the second direction and spans the orthographic projections of the adjacent micro semiconductor devices, and the second direction is different from the first direction. For example, the second direction is perpendicular to the first direction. In one embodiment, the orthographic projection of the second supporting layer is between the orthographic projections of the adjacent micro semiconductor devices. In one embodiment, the orthographic projection of the first supporting layer on the substrate does not overlap the orthographic projection of the electrode on the substrate. In one embodiment, the first supporting layer does not contact the electrode. In one embodiment, the ratio of a width of the first supporting layer to a width of the region is smaller than 1 and greater than or equal to 0.1. In one embodiment, the second supporting layer does not contact the electrode.

In one embodiment, the first supporting layer includes an organic material. In one embodiment, the organic material includes phenol formaldehyde resin, epoxy resin, polyisoprene rubber, or a combination thereof. In one embodiment, the second supporting layer includes silicon oxide, silicon nitride, silicon oxynitride, or a combination thereof. In one embodiment, the first supporting layer or the second supporting layer includes a thermal denatured material. In one embodiment, the thermal denatured material includes cold-short materials, hot melting materials, photoresist materials, or a combination thereof. In one embodiment, the Young's modulus of the first supporting layer is smaller than the Young's modulus of the second supporting layer. In one embodiment, the thickness of any one of the first supporting layers is greater than the thickness of the electrode. In one embodiment, the sum of the thickness of any one of the first supporting layers and the thickness of any of the second supporting layers is greater than the thickness of the electrode. In one embodiment, the width of any one of the first supporting layers is greater than the width of any one of the second supporting layers. In one embodiment, the first supporting layer or the second supporting layer has a shape which has a greater top width and a smaller bottom width.

BRIEF DESCRIPTION OF THE DRAWINGS

A detailed description is given in the following embodiments with reference to the accompanying drawings. It should be emphasized that many features are not drawn to scale according to industry standard practice. In fact, the dimensions of the various components may be arbitrarily increased or decreased for clarity of discussion.

DETAILED DESCRIPTION

It should be understood that the following disclosure provides many different embodiments or examples, for implementing different features of the embodiments of the present invention. Specific embodiments or examples of components and arrangements are described below to simplify the present disclosure. Of course, these are merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. Furthermore, in the embodiments of the present invention, some element symbols and/or letters may be repeated in many examples. These repetitions are for the purpose of simplification and clarity and are not intended to represent a particular relationship between the various embodiments and/or configurations discussed.

Furthermore, spatially relative terms, for example, "beneath" "below" "lower" "above" "upper" and the like, may be used herein for ease of description to describe one element or feature's relationship to another element(s) or feature(s) as illustrated in the figures. These spatially relative terms are intended to encompass different orientations of the device in use or operation in addition to the orientation depicted in the figures. The device may be otherwise oriented (rotated 90 degrees or at another orientations) and the spatially relative descriptors used herein may likewise be interpreted accordingly.

Figure 1A:
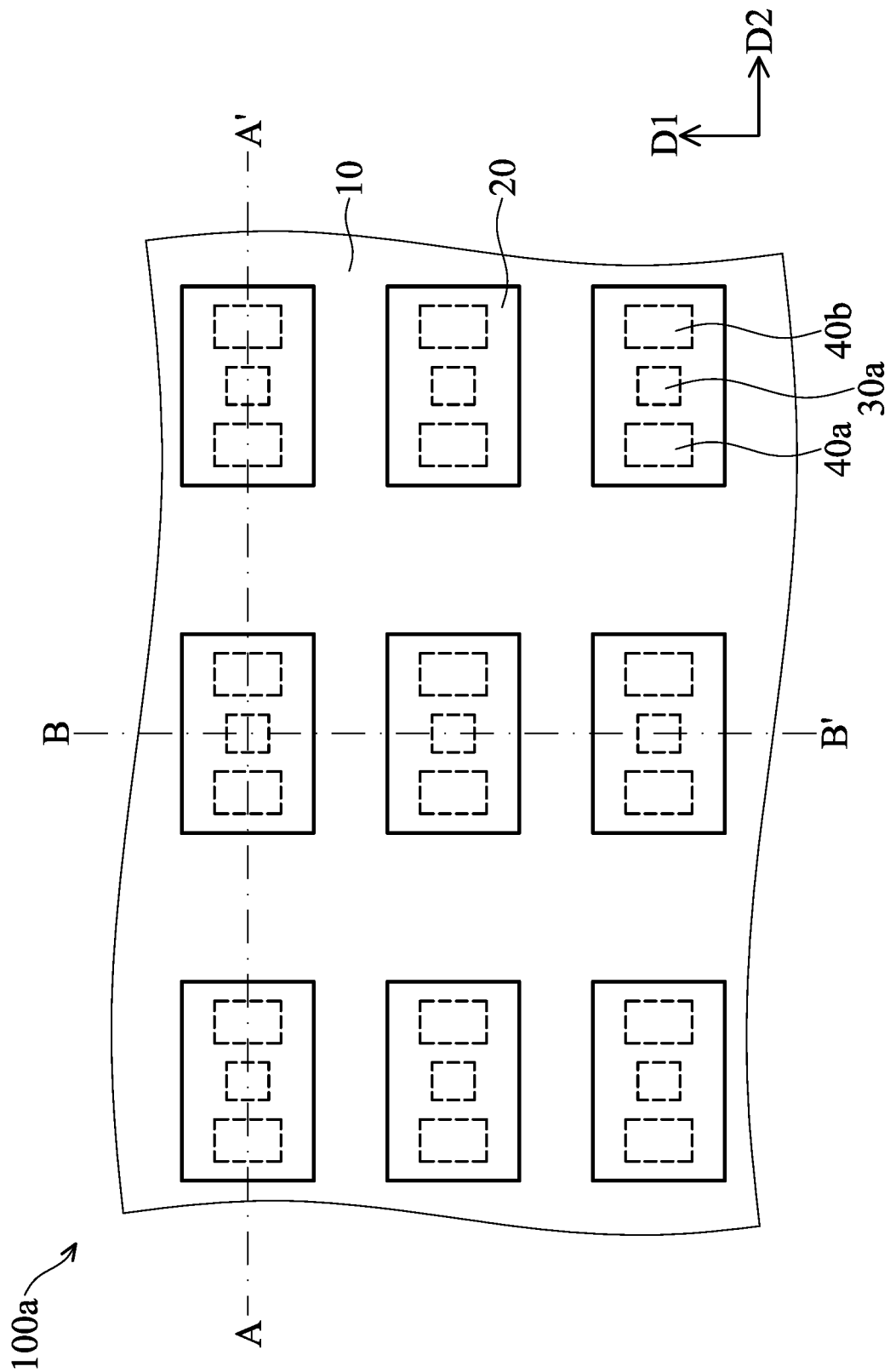
FIG. 1A is a top view showing a micro semiconductor structure 100a in accordance with one embodiment of the disclosure.

Referring first to FIG. 1A, the following embodiments of the present invention describe a structure of a micro semiconductor device 20 (for example, a micro LED and a microchip) that may be used on a substrate 10. The substrate 10 may be, for example, a carrier substrate, and the micro semiconductor device 20 may be subsequently transferred to a receiving substrate. The "micro" semiconductor device 20 as used herein means that it may have a size of 1 µm to 100 µm. In some embodiments, the micro semiconductor device 20 may have a maximum width of 20 µm, 10 µm, or 5 µm. In some embodiments, the micro semiconductor device 20 may have a maximum height smaller than 10 µm or 5 µm.

However, it should be understood that embodiments of the present invention are not limited thereto, and aspects of certain embodiments may be applied to larger and perhaps smaller scales.

In addition, the receiving substrate may be, for example, a display substrate, a light-emitting substrate, a substrate having a functional element (such as a thin film transistor or an integrated circuit), or other types of circuit substrates, but the receiving substrate is not limited to the above-mentioned type. Although some embodiments of the present invention specifically describe a micro semiconductor device 20 including a p-n diode, it should be understood that embodiments of the present invention are not limited to these embodiments, and certain embodiments may be applied to another micro semiconductor devices 20, including a micro semiconductor device 20 (for example, a diode, a transistor, or an integrated circuit) which can be controlled to perform predetermined electronic functions or a micro semiconductor device 20 (for example, a light-emitting diode, a laser diode, or a photodiode) which can be controlled to perform predetermined opto-electronic functions. Other embodiments of the invention may also be applied to microchips including circuits, such as microchips using silicon or semiconductor-on-insulator (SOI) wafers as the material and used in logic or memory applications or microchips using gallium arsenide (GaAs) wafers as a material and used in RF communication applications.

Figure 1B:
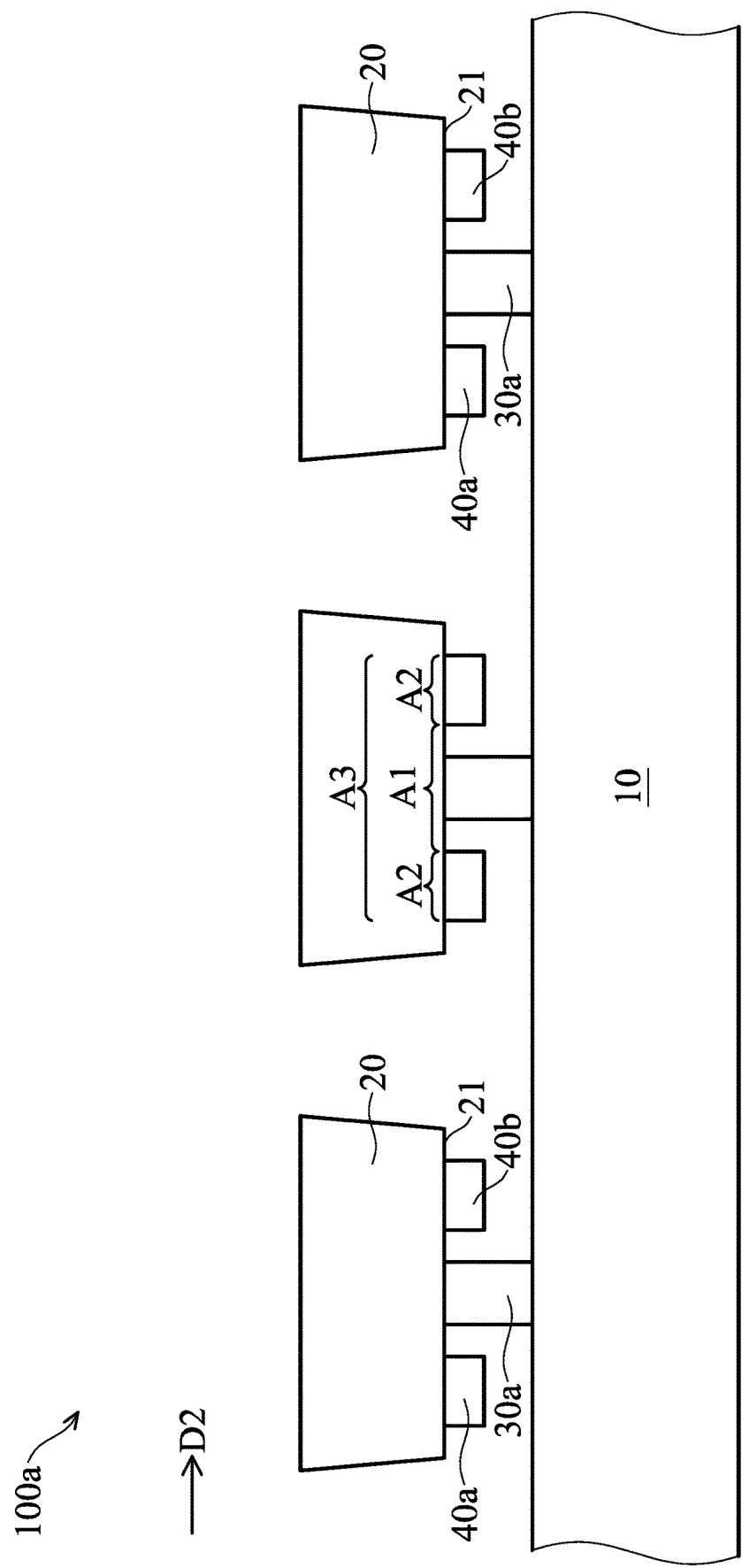
FIG. 1B is a cross-sectional view of the micro semiconductor structure 100a taken along line A-A' of FIG. 1A.
Figure 1C:
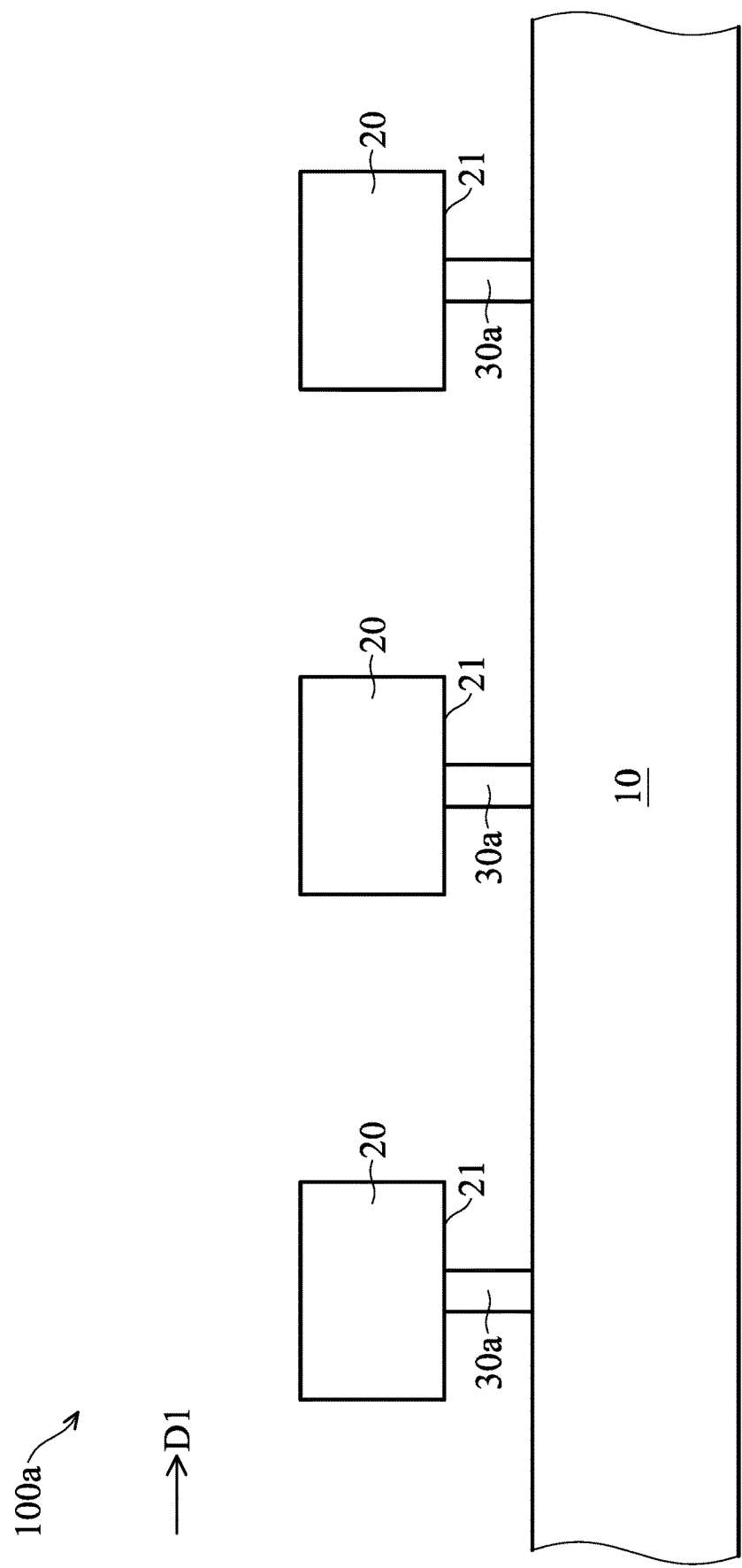
FIG. 1C is a cross-sectional view of the micro semiconductor structure 100a taken along line B-B' of FIG. 1A.
Figure 1D:
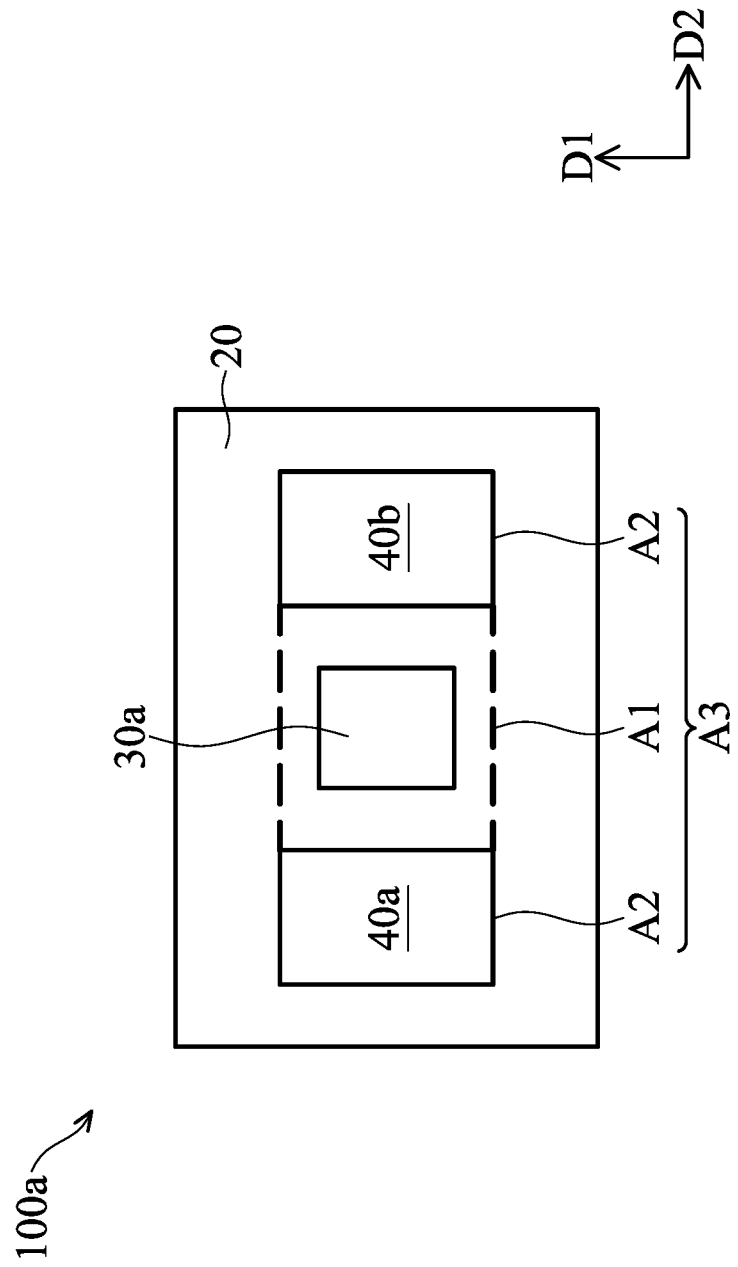
FIG. 1D is a bottom view of any one of the micro semiconductor devices 20 of FIG. 1A.

FIG. 1A is a top view showing a micro semiconductor structure 100a in accordance with one embodiment of the disclosure. FIG. 1B is a cross-sectional view of the micro semiconductor structure 100a taken along line A-A' of FIG. 1A. FIG. 1C is a cross-sectional view of the micro semiconductor structure 100a taken along line B-B' of FIG. 1A. FIG. 1D is a bottom view of any one of the micro semiconductor devices 20 of FIG. 1A (the substrate 10 is not shown).

Referring to FIGS. 1A-1C, the micro semiconductor structure 100a of this embodiment includes a substrate 10, a plurality of micro semiconductor devices 20 and a plurality of the first supporting layers 30. The micro semiconductor devices 20 are disposed on the substrate 10, and each of the micro semiconductor devices 20 has a first electrode 40a and a second electrode 40b. The first electrode 40a and the second electrode 40b are disposed on the lower surface 21 of the micro semiconductor devices 20. The first electrode 40a and the second electrode 40b have opposite electrical properties. The first supporting layer 30a is disposed between the substrate 10 and the micro semiconductor devices 20, and it is disposed between the first electrode 40a and the second electrode 40b. In some embodiments, the substrate 10 includes a carrier substrate. The carrier substrate may be, for example, a plastic substrate, a glass substrate, a sapphire substrate, or another substrate having no wires. The first supporting layer 30 may include organic material (such as benzocyclobutene, phenol formaldehyde resin, epoxy resin, polyisoprene rubber), inorganic material (such as silicon oxide, silicon nitride, silicon oxynitride, or a combination thereof), or other thermal denatured materials (such as cold-short materials, hot melting materials, photoresist materials, or a combination thereof), or a combination thereof. In some embodiments, the Young's modulus of the first supporting layer 30a is smaller than the Young's modulus of the substrate 10 and also smaller than the Young's modulus of the micro semiconductor device 20. Therefore, the first supporting layer 30a can be used as a buffer during the fabrication process.

Referring to FIGS. 1B and 1D, the lower surface of the micro semiconductor device 20 includes a first region A1 and a second region A2, and the first region A1 is between the first electrode 40a and the second electrode 40b. The regions which the first electrode 40a and the second electrode 40b are in contact with the lower surface 21 are defined as the second region A2. The first region A1 and the second regions A2 are collectively defined as the third region A3.

In some embodiments, the first supporting layer 30a may be formed and fixed on the lower surface 21 of the micro semiconductor device 20. Then, the first supporting layer 30a and the micro semiconductor device 20 are placed on the substrate 10 together to form a micro semiconductor structure 100a. Afterwards, the micro semiconductor device 20 can be firmly connected to the substrate 10 by fixing the substrate 10 on the lower surface 21 of the first supporting layer 30a.

In other embodiments, the first supporting layer 30a may be formed and fixed on the substrate 10. Then, the micro semiconductor device 20 is placed on the substrate 10, and the lower surface 21 of the micro semiconductor device 20 faces the substrate 10 and the first supporting layer 30a to form a micro semiconductor structure 100a. Afterwards, the micro semiconductor device 20 can be firmly connected to the substrate 10 by fixing the first supporting layer 30a on the lower surface 21 of the micro semiconductor device 20.

In addition, by placing the micro semiconductor structures 20 on the substrate 10, the spacing between the micro semiconductor structures 20 can be kept at a certain value, which can prevent damage caused by improper spacing between the micro semiconductor devices 20 during the subsequent transferring process. Furthermore, the micro semiconductor devices 20 on the substrate 10 may be picked up by the above-mentioned transferring process, and the micro semiconductor devices 20 may be transferred onto the receiving substrate to form a semiconductor device. For example, the micro semiconductor device 20 may be a micro light-emitting semiconductor device, the substrate 10 may be a display substrate, and the micro semiconductor device 20 may be transferred onto the substrate 10 to form a semiconductor device. The resulted semiconductor device may be a micro LED display.

In this embodiment, the thickness of the first supporting layer 30a is greater than the thickness of the first electrode 40a, the thickness of the first supporting layer 30a is greater than the thickness of the second electrode 40b, and the first supporting layer 30a directly contacts the first region A1. Therefore, the micro semiconductor device 20 can be elevated, so that the first electrode 40a and the second electrode 40b do not contact the substrate 10, which can prevent the substrate 10 from contacting the first electrode 40a and the second electrode 40b to cause damage. It is also easier to pick up the elevated micro semiconductor devices 20 when the micro semiconductor devices 20 are transferred onto the receiving substrate. The ratio of the contacting area between the first supporting layer 30a and the first region A1 to the area of the first region A1 is between 0.1 and 0.8. If the ratio is smaller than 0.1, the supporting force may be insufficient. If the ratio is greater than 0.8, the pickup force may be increased when the micro semiconductor device 20 is transferred and picked up. When the micro semiconductor device 20 is transferred, the first supporting layer 30a may be completely detached or partially detached from the substrate 10, together with the micro semiconductor device 20, or the first supporting layer 30a may completely remain on the substrate 10. In some embodiments, the first supporting layer 30a is picked up along with the micro semiconductor device 20, and the thickness of the first supporting layer 30a is greater than the thickness of the first electrode 40a or the thickness of the second electrode 40b. In such embodiments, the first supporting layer 30a can be used as a buffer structure. When the micro semiconductor device 20 is transferred onto the receiving substrate, the first supporting layer 30a contacts the receiving substrate first to achieve the buffering function, so as to prevent the first electrode 40a and the second electrode 40b from directly colliding with the receiving substrate to cause damage.

In some embodiments, the orthographic projection of the first supporting layer 30a on the substrate 10 at least overlaps the orthographic projection of a portion of the first region A1 on the substrate 10. When the micro semiconductor device 20 is transferred, the first supporting layer 30a is completely detached or partially detached from the substrate 10, together with the micro semiconductor device 20. In such embodiments, during the subsequent high temperature process (for example, eutectic bonding), the first supporting layer 30a may also be used as a blocking structure between the first electrode 40a and the second electrode 40b to prevent the first electrode 40a and the second electrode 40b which are in the molten state from contacting each other to cause short circuit.

In this embodiment, the orthographic projection of the first supporting layer 30a on the substrate 10 does not overlap the orthographic projection of the first electrode 40a or the second electrode 40b on the substrate 10. In other words, the orthographic projection of the first supporting layer 30a on the substrate 10 is completely located within the orthographic projection of the first region A1 on the substrate 10. Compared with the situation where the supporting layer exceeds the lower surface 21 of the micro semiconductor device 20, such an embodiment can prevent the supporting layer from occupying the space beside the side of the micro semiconductor device 20, so that the micro semiconductor device 20 can be densely arranged on the substrate 10.

In some embodiments, the ratio of the width of the first supporting layer 30a to the width of the first region A1 is smaller than 1, and the ratio is greater than or equal to 0.1. When the ratio of the width of the first supporting layer 30a to the width of the first region A1 is smaller than 1, the first supporting layer 30a does not contact the first electrode 40a or the second electrode 40b, which can prevent the first supporting layer 30a from pressing the first electrode 40a and the second electrode 40b to causes damage. On the other hand, when the ratio of the width of the first supporting layer 30a to the width of the first region A1 is greater than or equal to 0.1, it is ensured that the first supporting layer 30a stably supports the micro semiconductor device 20.

In some embodiments, the first supporting layer 30a includes a thermal denatured material. The thermal denatured material may include a cold-short material, a hot melting material, a thermally volatile material, or a combination thereof. When the first supporting layer 30a is a cold-short material, before the micro semiconductor device 20 is picked up and transferred onto the receiving substrate, a cooling process may be performed on the first supporting layer 30a to embrittle the first supporting layer 30a to ensure that the first supporting layer 30a can be broken when the micro semiconductor device 20 is picked up. The cooling process can make the process for picking up and transferring the micro semiconductor device 20 become smoother and increase the success rate of the process for picking up and transferring the micro semiconductor device 20. The temperature of the cooling process may depend on the cold-short temperature of the cold-short material. The temperature of the cooling process may be, for example, from about −300° C. to about 0° C., or, for example, from about −100° C. to about −10° C.

In some embodiments, when the first supporting layer 30a is a hot melting material or a thermally volatile material, before the micro semiconductor device 20 is transferred onto the receiving substrate, a heating process may be performed on the first supporting layer 30a to melt or volatilize the first supporting layer 30a to ensure that the first supporting layer 30a can be broken when the micro semiconductor device 20 is picked up. The heating process can make the process for picking up and transferring the micro semiconductor device 20 become smoother and increase the success rate of the process for picking up and transferring the micro semiconductor device 20. The temperature of the heating process may depend on the melting point temperature of the hot melting material. The temperature of the heating process may be, for example, from about 40° C. to about 300° C., or, for example, from about 50° C. to about 180° C.

Figure 1E:
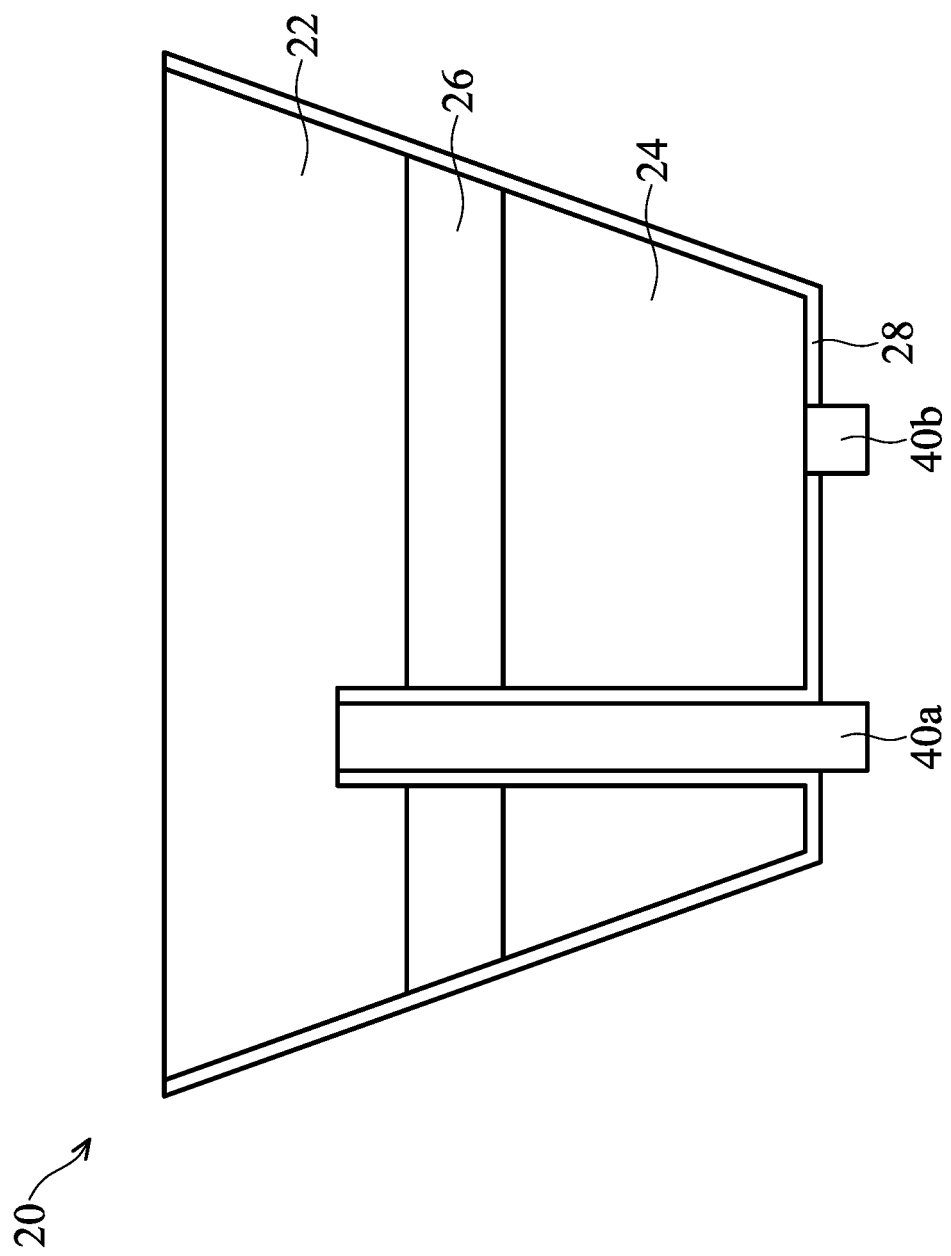
FIG. 1E is a specific example of the micro semiconductor device 20 of FIGS. 1A-1D.

FIG. 1E is a specific example of the micro semiconductor device 20 of FIGS. 1A-1D. In this example, the micro semiconductor device 20 includes a first semiconductor layer 22, a second semiconductor layer 24, a light-emitting layer 26, an insulating layer 28, a first electrode 40a, and a second electrode 40b. The second semiconductor layer 24 is disposed under the first semiconductor layer 22, and the light-emitting layer 26 is disposed between the first semiconductor layer 22 and the second semiconductor layer 24. The first electrode 40a passes through the light-emitting layer 26 and the second semiconductor layer 24 to the first semiconductor layer 22, and it is electrically connected to the first semiconductor layer 22. The second electrode 40b is disposed on the second semiconductor layer 24, and it is electrically connected to the second semiconductor layer 24. The insulating layer 28 is disposed on the lower surface of the second semiconductor layer 24 and on the sidewalls of the first semiconductor layer 22, the light-emitting layer 26, and the second semiconductor layer 24, and it exposes the lower surfaces of the first electrode 40a and the second electrode 40b. In accordance with some embodiments of the present disclosure, the insulating layer 28 may further cover the sidewalls of the first electrode 40a and the second electrode 40b of the micro semiconductor device 20. FIG. 1E is merely an example of the micro semiconductor device 20 of the present invention, and is not intended to limit the type of the micro semiconductor device 20. The micro semiconductor device 20 of the present invention may be any suitable micro semiconductor device. Although the micro semiconductor device 20 shown in FIG. 1E is an inverted trapezoid which has a greater top width and a smaller bottom width, the present invention is not limited thereto, and the micro semiconductor device 20 may also be a positive trapezoid which has a smaller top width and a greater bottom width, a rectangle, or another suitable shape. The number of the first electrode 40a and the second electrode 40b shown in this embodiment is respectively only one, but the invention is not limited to these embodiments, and there may be a plurality of first electrodes and second electrodes.

Figure 2:
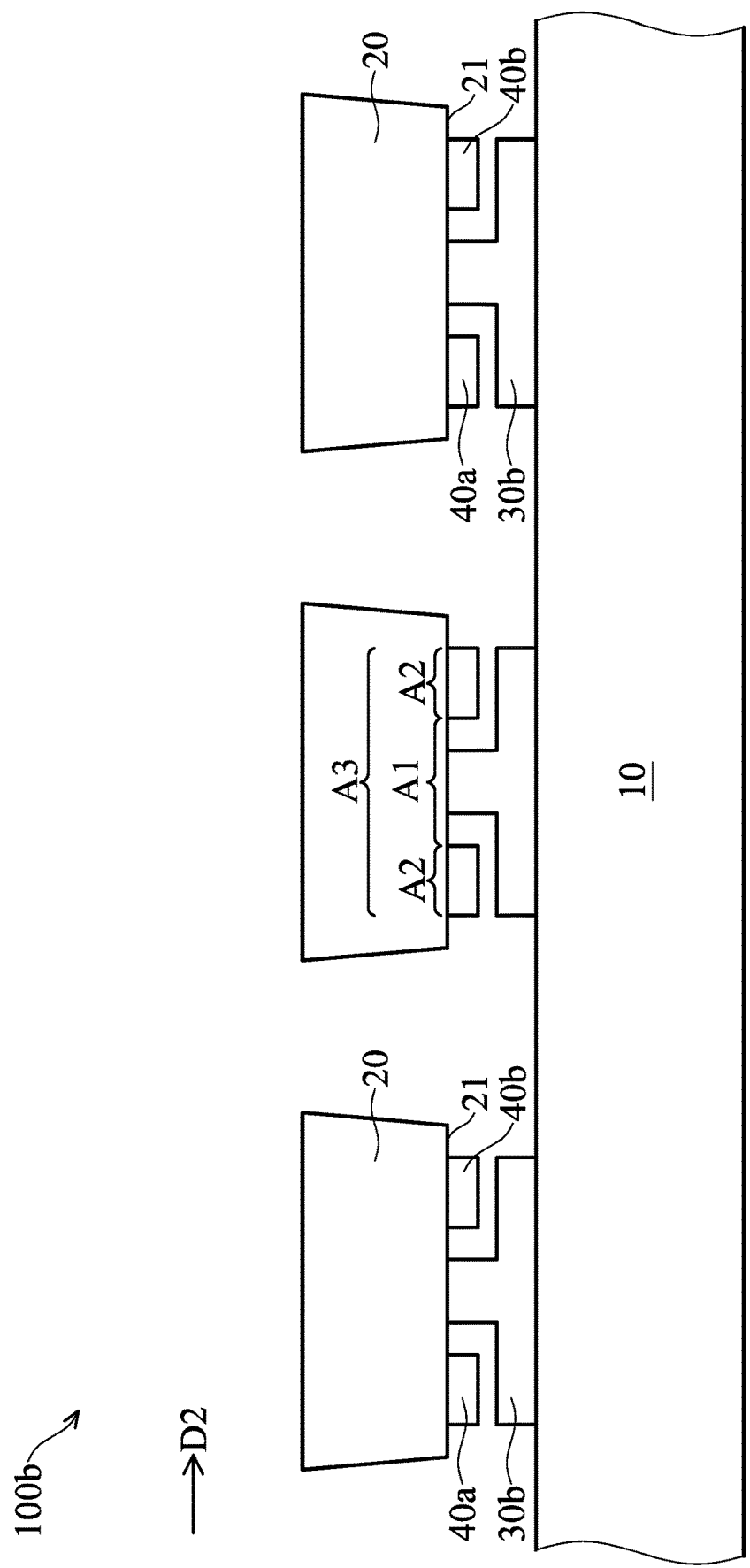
FIG. 2 is a cross-sectional view showing a micro semiconductor structure 100b in accordance with another embodiment of the disclosure.

FIG. 2 is a cross-sectional view showing a micro semiconductor structure 100b in accordance with another embodiment of the disclosure. Referring to FIGS. 2 and 1B, the micro semiconductor structure 100b of FIG. 2 is similar to the micro semiconductor structure 100a of FIG. 1B. The difference between FIG. 2 and FIG. 1B is that, in the embodiment shown in the FIG. 2, the first supporting layer 30b extends along the second direction D2 from the region which is between the first electrode 40a and the second electrode 40b to the region which is below the first electrode 40a and the second electrode 40b. Therefore, the orthographic projection of the first supporting layer 30b on the substrate 10 extends from the orthographic projection of the first region A1 on the substrate 10 to the orthographic projection of the second region A2 on the substrate 10. Compared with the micro semiconductor structure 100a shown in FIG. 1B, in the micro semiconductor structure 100b shown in FIG. 2, the width of the bottom of the first supporting layer 30b is larger, so the contacting area between the first supporting layer 30b and the substrate 10 is larger, and the micro semiconductor device 20 can be more stably supported by the first supporting layer 30b. In this embodiment, the first supporting layer 30b does not contact the first electrode 40a or the second electrode 40b, which can prevent the first supporting layer 30b from pressing the first electrode 40a and the second electrode 40b to causes damage.

Figure 3:
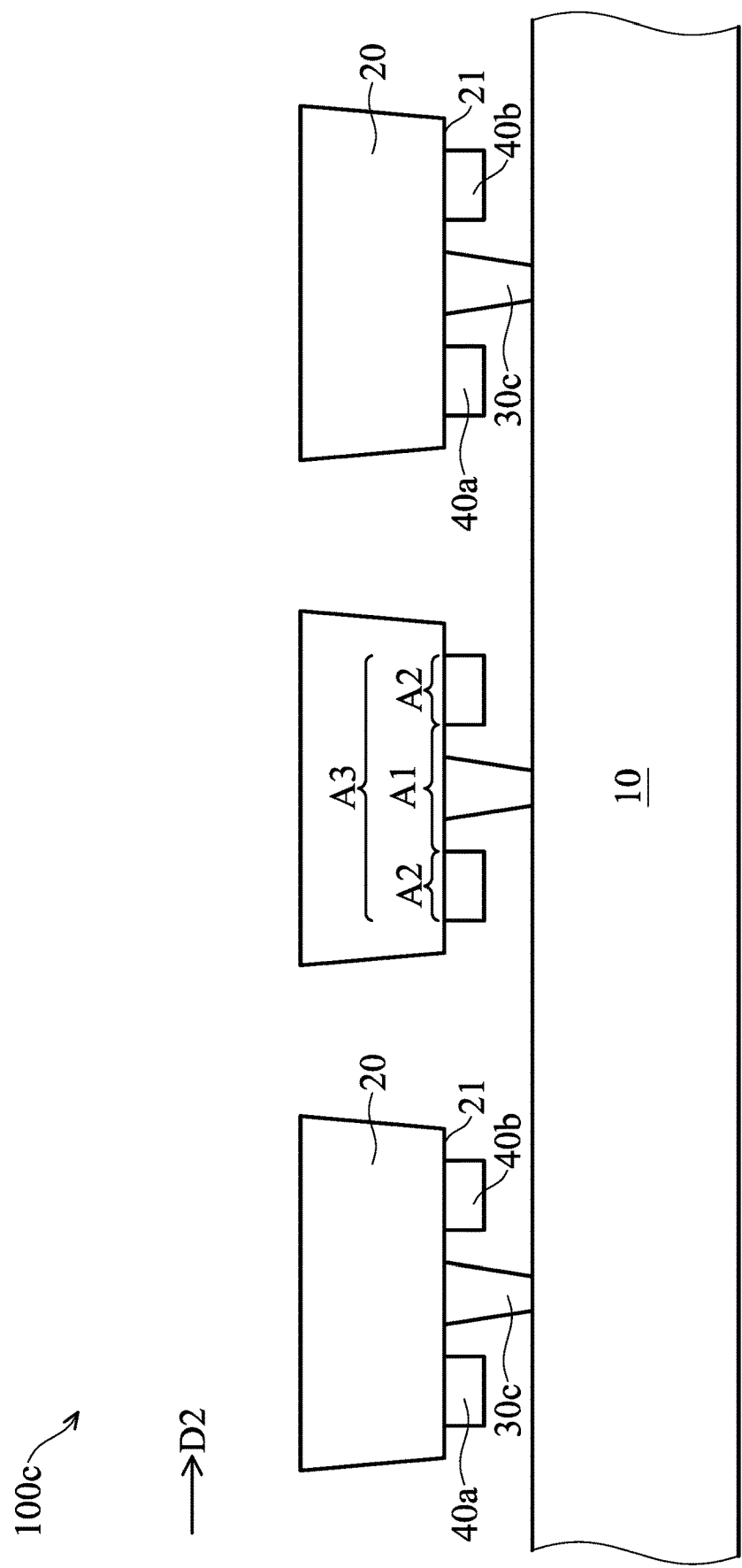
FIG. 3 is a cross-sectional view showing a micro semiconductor structure 100c in accordance with another embodiment of the disclosure.

FIG. 3 is a cross-sectional view showing a micro semiconductor structure 100c in accordance with another embodiment of the disclosure. Referring to FIGS. 3 and 1B, the micro semiconductor structure 100c of FIG. 3 is similar to the micro semiconductor structure 100a of FIG. 1B. The difference between FIG. 3 and FIG. 1B is that, in the embodiment shown in the FIG. 3, the first supporting layer 30c has a shape which has a greater top width and a smaller bottom width. Compared with the micro semiconductor structure 100a shown in FIG. 1B, the width of the bottom of the first supporting layer 30c of the micro semiconductor structure 100c shown in FIG. 3 is smaller, the contacting area between the first supporting layer 30c and the substrate 10 is small, so that the required pickup force is reduced when the micro semiconductor device 20 is picked up and transferred. Although the first supporting layer 30c shown in FIG. 3 is an inverted trapezoid which has a greater top width and a smaller bottom width, the present invention is not limited thereto, and the first supporting layer 30c may also be a T-shape or another suitable shape.

Figure 4:
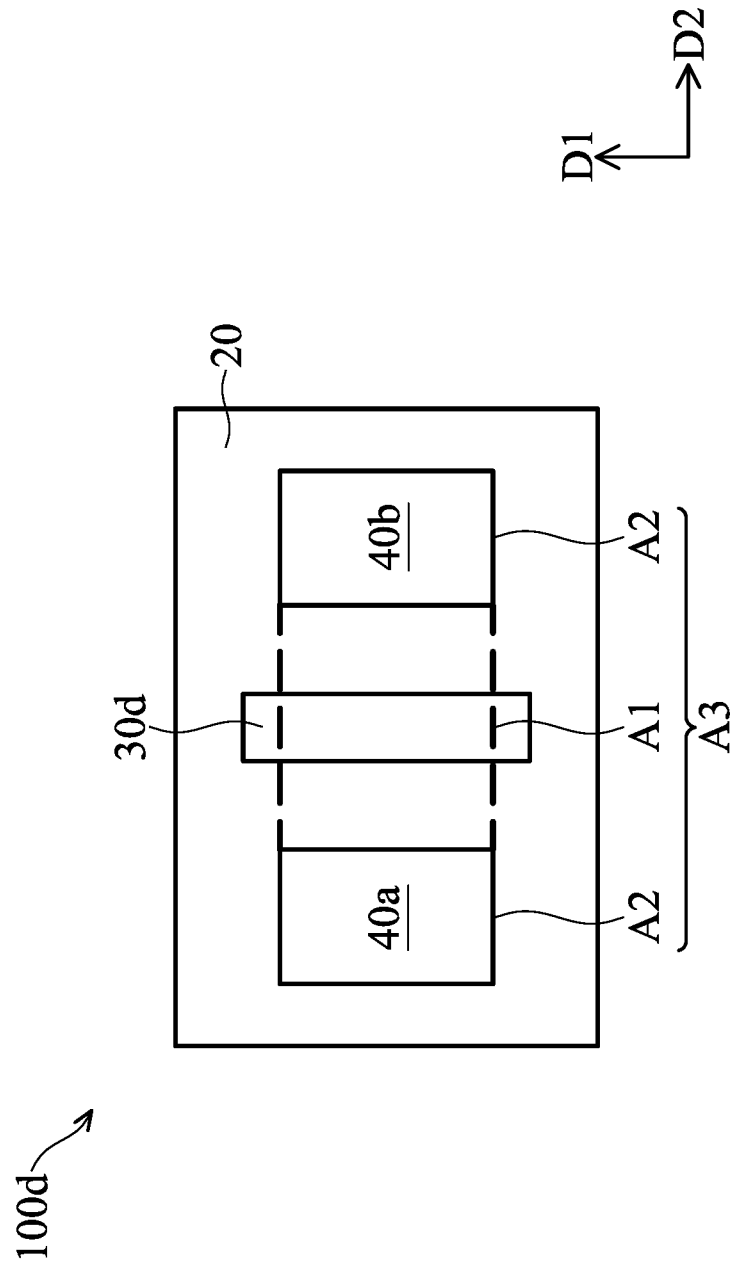
FIG. 4 is a bottom view showing a micro semiconductor device 20 of a micro semiconductor structure 100d in accordance with another embodiment of the disclosure.

FIG. 4 is a bottom view showing a micro semiconductor device 20 of a micro semiconductor structure 100d in accordance with another embodiment of the disclosure. Referring to FIGS. 4 and 1D, the micro semiconductor structure 100d of FIG. 4 is similar to the micro semiconductor structure 100a of FIG. 1D. The difference between FIG. 4 and FIG. 1D is that, in the embodiment shown in the FIG. 4, the orthographic projection of the first supporting layer 30d extends outward along the first direction D1 from the orthographic projection of the first region A1 to the outside of the orthographic projection of the first region A1. The first direction D1 is different from the second direction D2. The first direction D1 may be, for example, perpendicular to the second direction D2. Compared with the micro semiconductor structure 100a of FIG. 1D, in the micro semiconductor structure 100 of the embodiment of FIG. 4, the contacting area between the lower surface 21 of the micro semiconductor device 20 and the first supporting layer 30d and the substrate 10 is larger. Therefore, the first supporting layer 30d can give the micro semiconductor device 20 a larger supporting force, and it can support the micro semiconductor device 20 more stably.

Figure 5A:
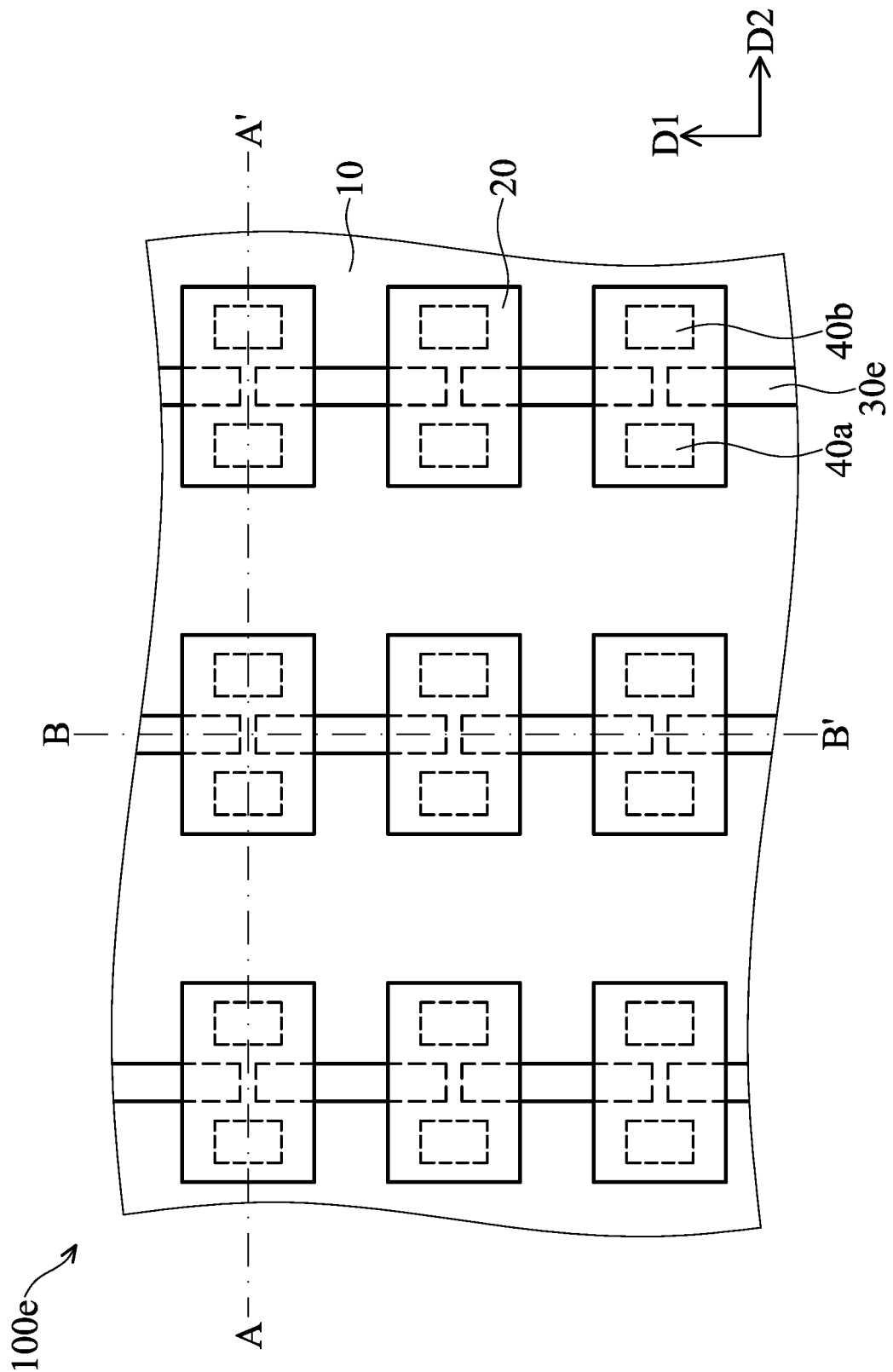
FIG. 5A is a top view showing a micro semiconductor structure 100e in accordance with one embodiment of the disclosure.
Figure 5B:
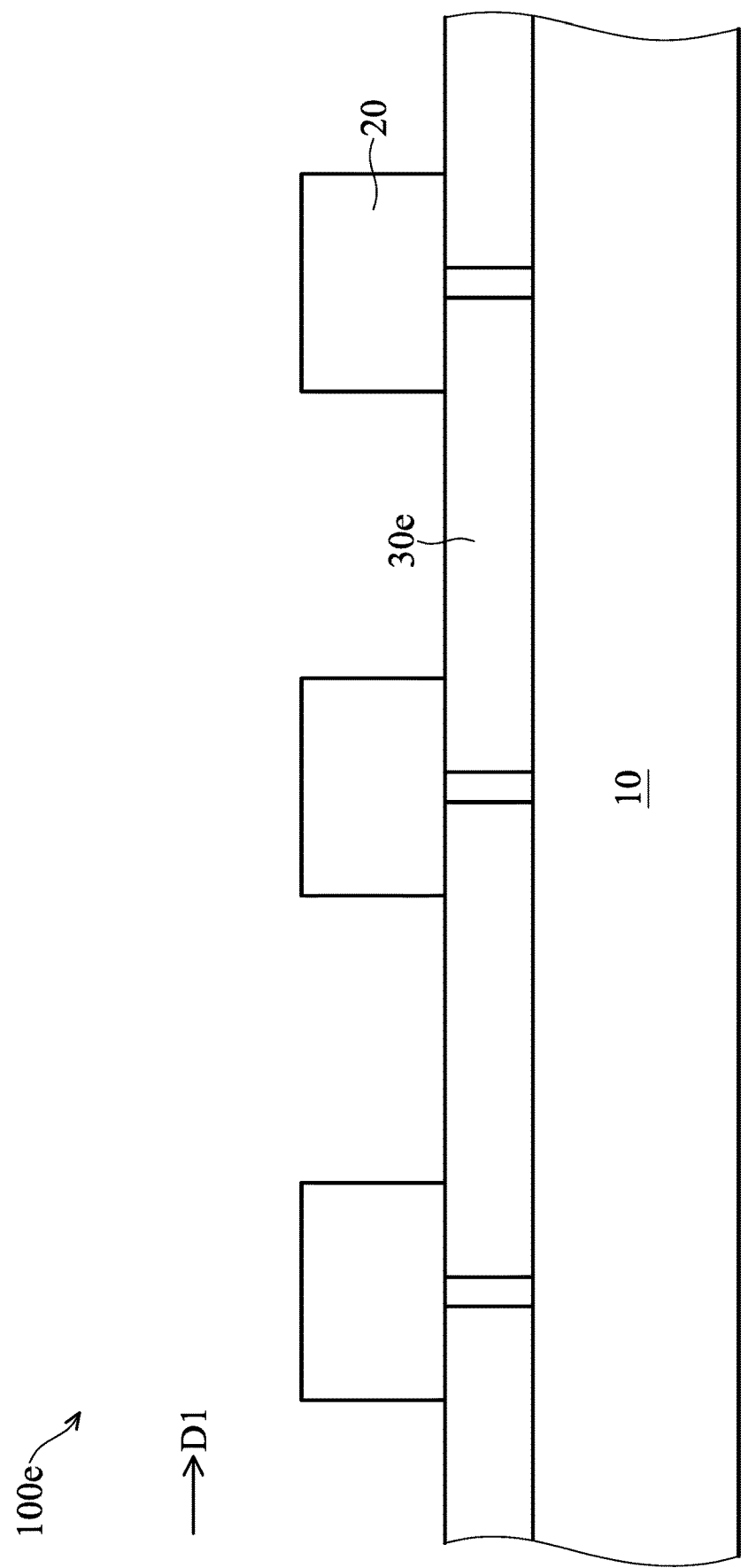
FIG. 5B is a cross-sectional view of the micro semiconductor structure 100e taken along line B-B' of FIG. 5A.
Figure 5C:
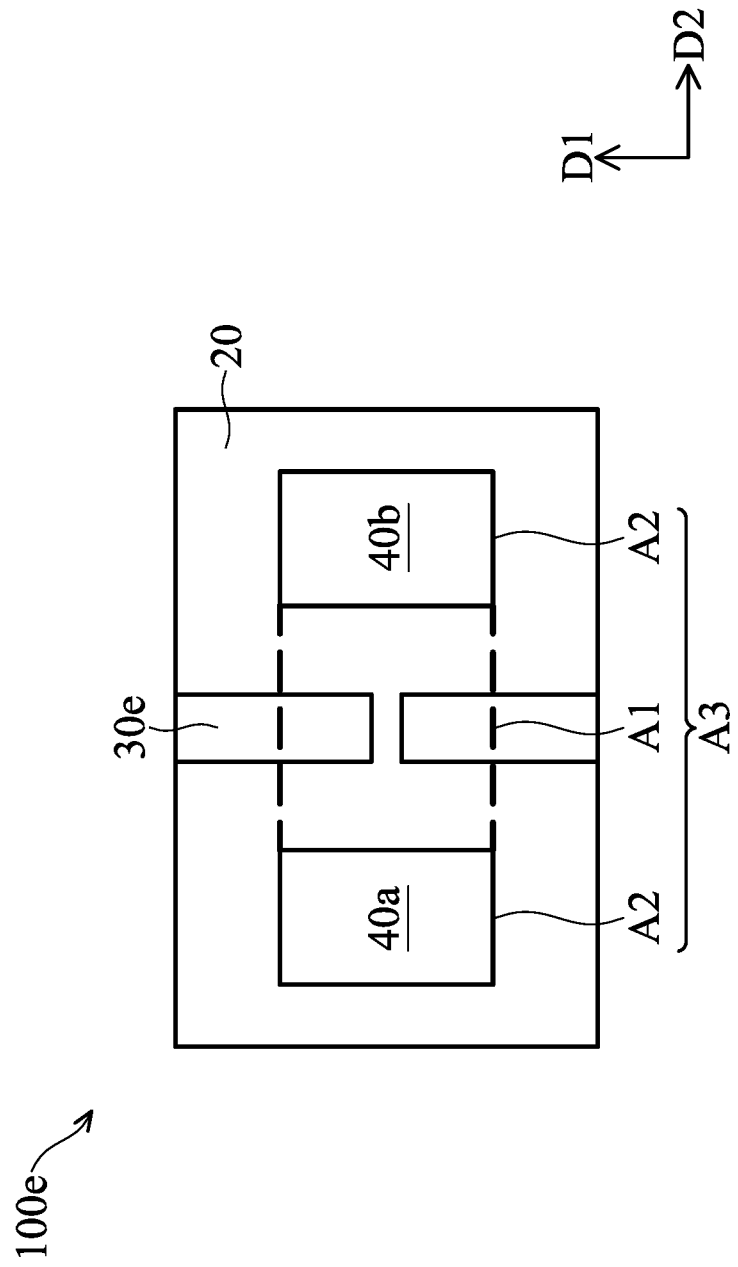
FIG. 5C is a bottom view of any one of the micro semiconductor devices 20 of FIG. 5A.

FIG. 5A is a top view showing a micro semiconductor structure 100e in accordance with one embodiment of the disclosure; FIG. 5B is a cross-sectional view of the micro semiconductor structure 100e taken along line B-B' of FIG. 5A; and FIG. 5C is a bottom view of any one of the micro semiconductor devices 20 of FIG. 5A (the substrate 10 is not shown).

The micro semiconductor structure 100e of FIG. 5A is similar to the micro semiconductor structure 100a of FIG. 1A. The difference between FIG. 5A and FIG. 1A is that, in the embodiment shown in the FIG. 5A, the orthographic projection of the first supporting layer 30e on the substrate 10 extends outward along the first direction D1 from the orthographic projection of the first region A1 into the orthographic projection of the first region A1 of the adjacent micro semiconductor device 20. In the orthographic projection of the first region A1, the orthographic projections of the adjacent first supporting layers 30e do not contact each other, and a plurality of discontinuous first supporting layers 30e are formed, as shown in FIG. 5C.

In this embodiment, as shown in FIG. 5B, the first supporting layer 30e only extends in the space which is below the adjacent micro semiconductor devices 20 in the first direction D1, but does not occupy the space beside the sidewalls of the adjacent micro semiconductor devices 20, so that the micro semiconductor devices 20 can be densely arranged on the substrate 10. In this embodiment, one micro semiconductor device 20 is supported by two adjacent first supporting layers 30e, so that the micro semiconductor device 20 can be more firmly supported. In addition, because the weight of the micro semiconductor device 20 is evenly distributed on two adjacent first supporting layers 30e, it is possible to avoid the weight of the micro semiconductor device 20 being concentrated on one first supporting layer 30e to cause the collapse of the first supporting layer 30e, and further to affect the process yield.

Figure 6A:
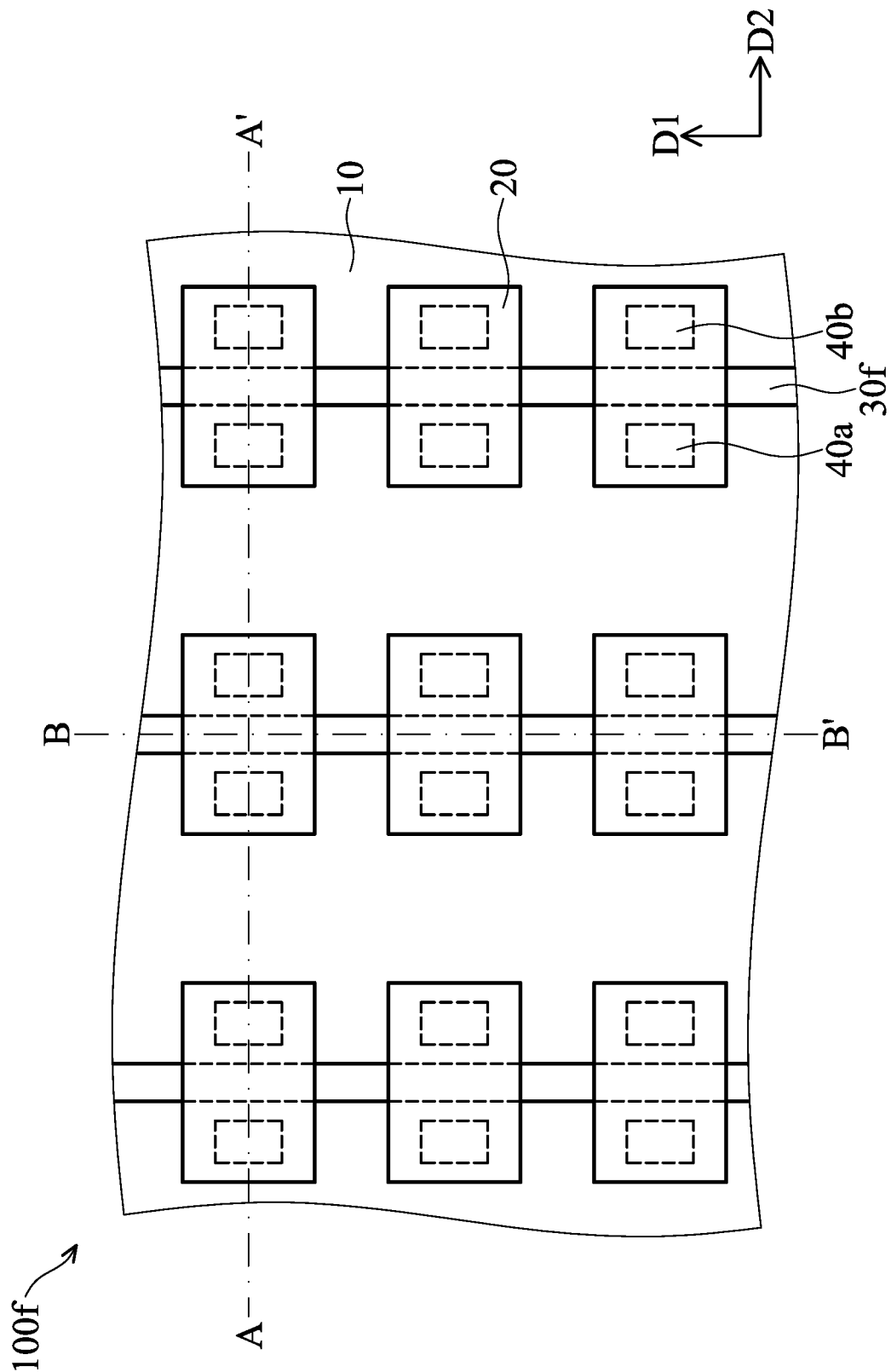
FIG. 6A is a top view showing a micro semiconductor structure 100f in accordance with one embodiment of the disclosure.
Figure 6B:
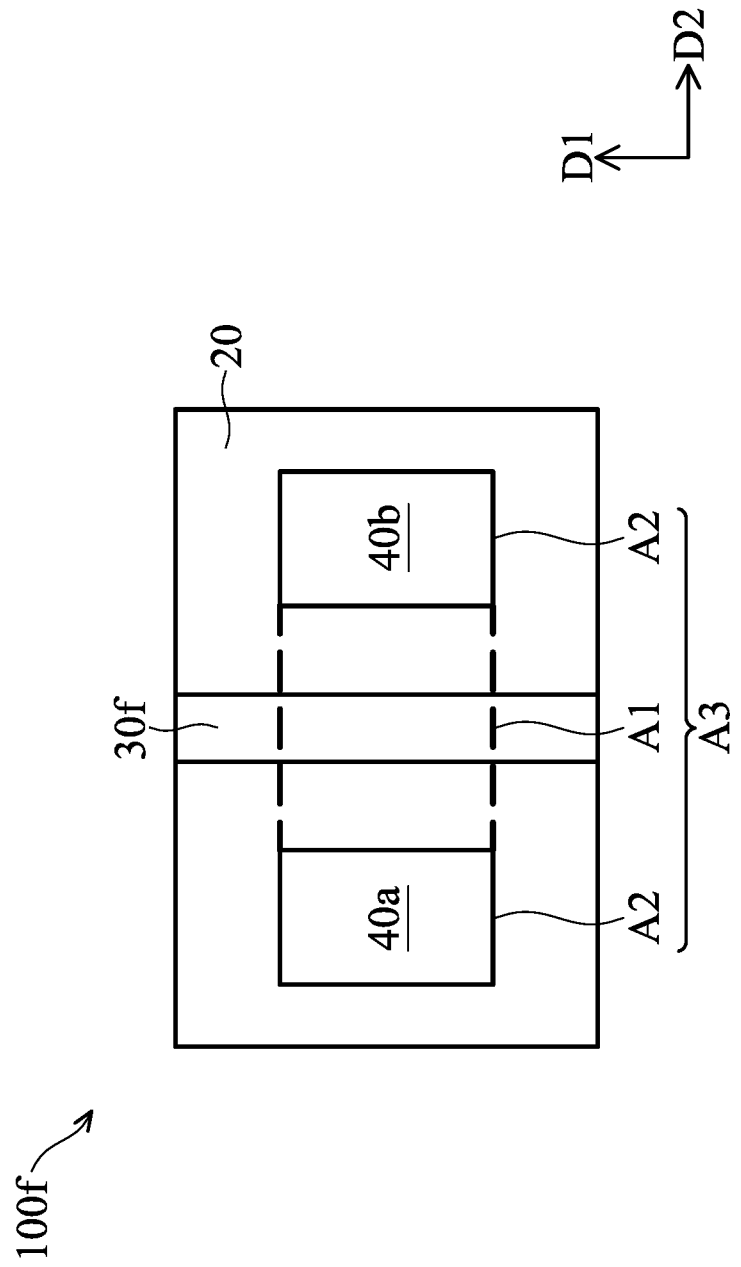
FIG. 6B is a bottom view of any one of the micro semiconductor devices 20 of FIG. 6A.

FIG. 6A is a top view showing a micro semiconductor structure 100f in accordance with one embodiment of the disclosure. FIG. 6B is a bottom view of any one of the micro semiconductor devices 20 of FIG. 6A (the substrate 10 is not shown). The micro semiconductor structure 100f of FIG. 6A is similar to the micro semiconductor structure 100e of FIG. 5A. The difference between FIG. 6A and FIG. 5A is that, in the embodiment shown in the FIG. 6A, in the orthographic projection of the first region A1, the orthographic projections of the adjacent first supporting layers 30f contact each other to form a continuous structure, as shown in FIG. 6B. In this embodiment, because the continuous structure (the first supporting layer 300 supports the micro semiconductor device 20 across the entire micro semiconductor device 20, the contacting area between the lower surface 21 of the micro semiconductor device 20 and the first supporting layer 30f is large, and the weight of the micro semiconductor device 20 is supported by the continuous structure which is formed by connecting a plurality of first supporting layers 30f Therefore, the first supporting layer 30f can support the micro semiconductor device 20 more stably.

Figure 7A:
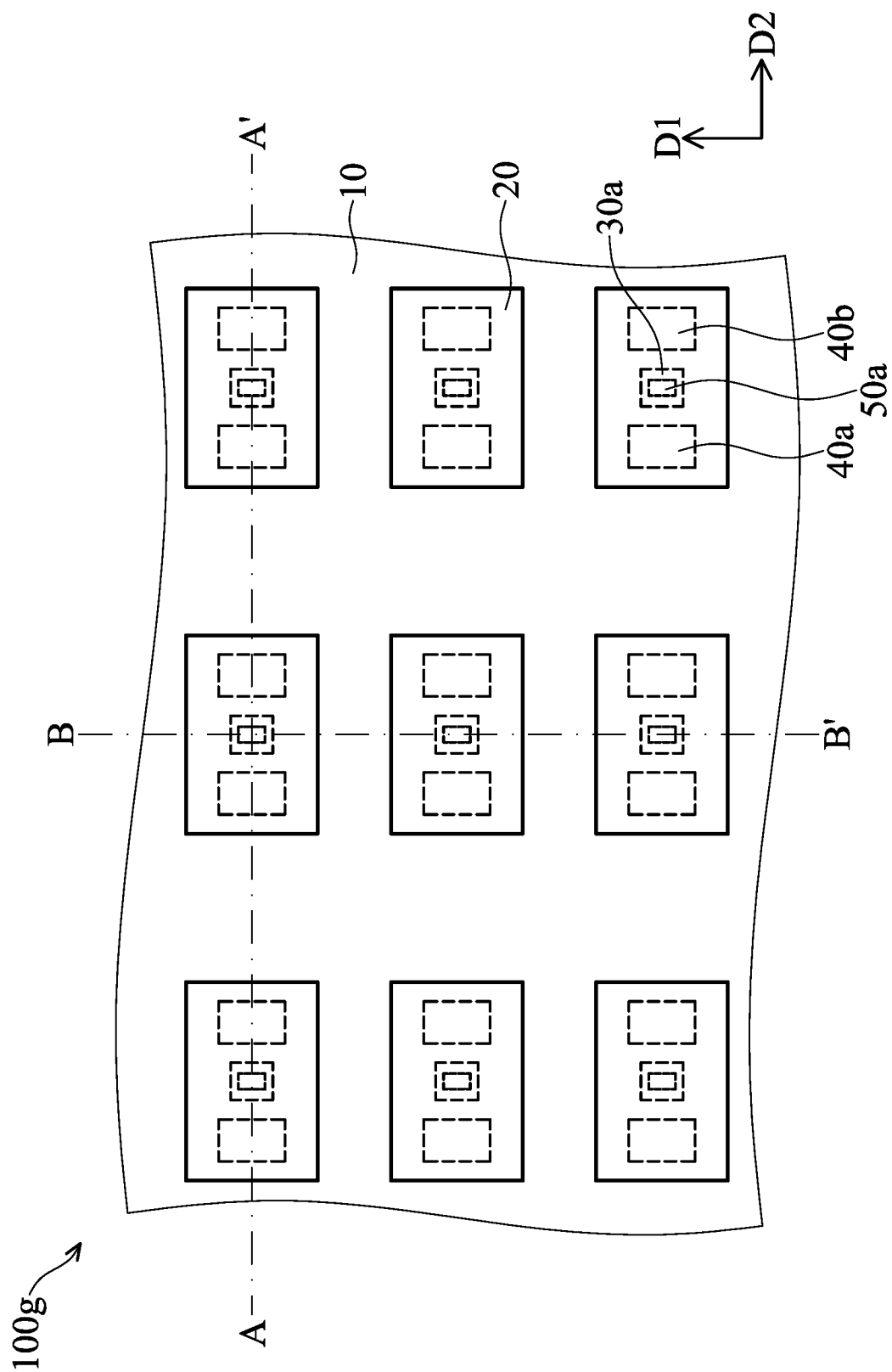
FIG. 7A is a top view showing a micro semiconductor structure 100g in accordance with one embodiment of the disclosure.
Figure 7B:
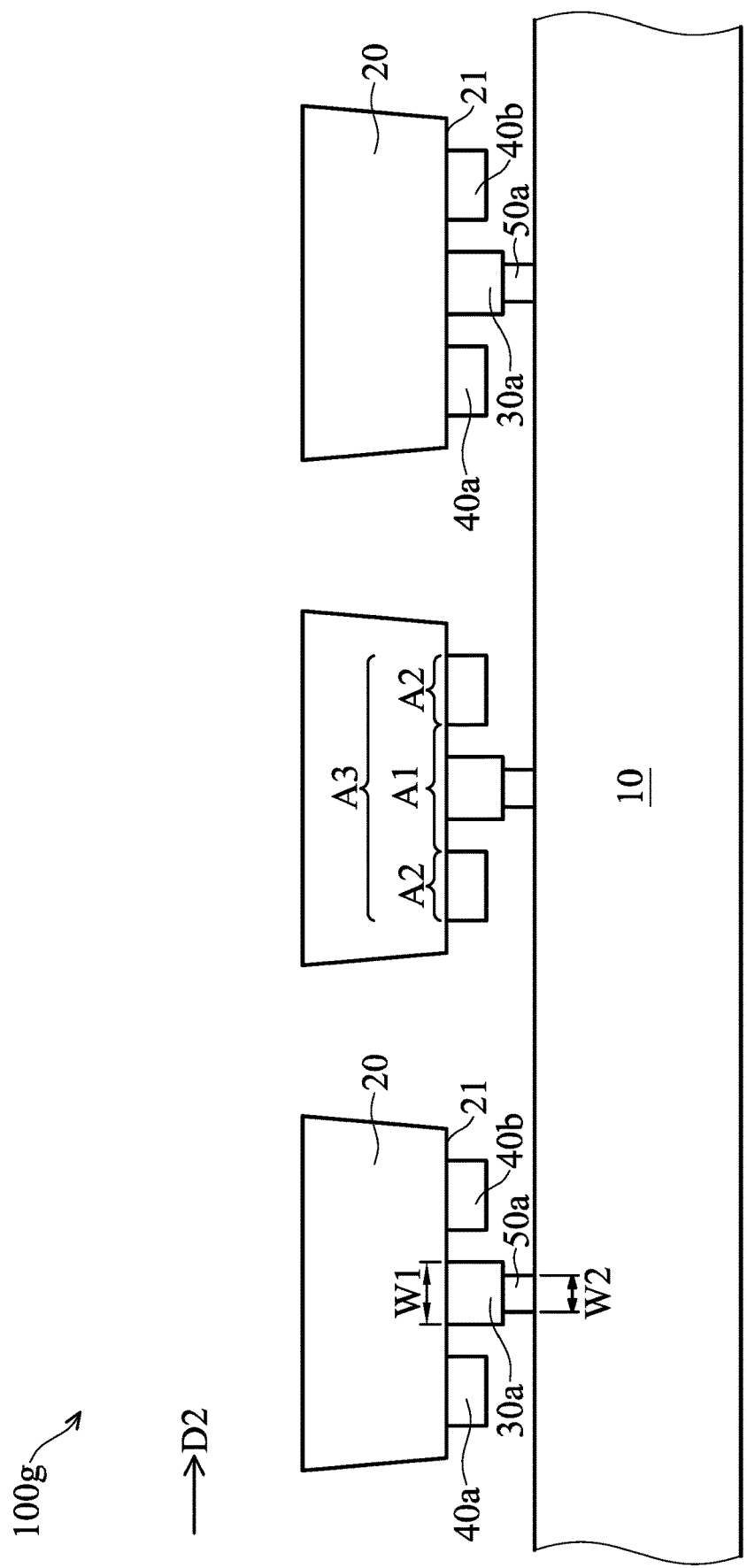
FIG. 7B is a cross-sectional view of the micro semiconductor structure 100g taken along line A-A' of FIG. 7A.
Figure 7C:
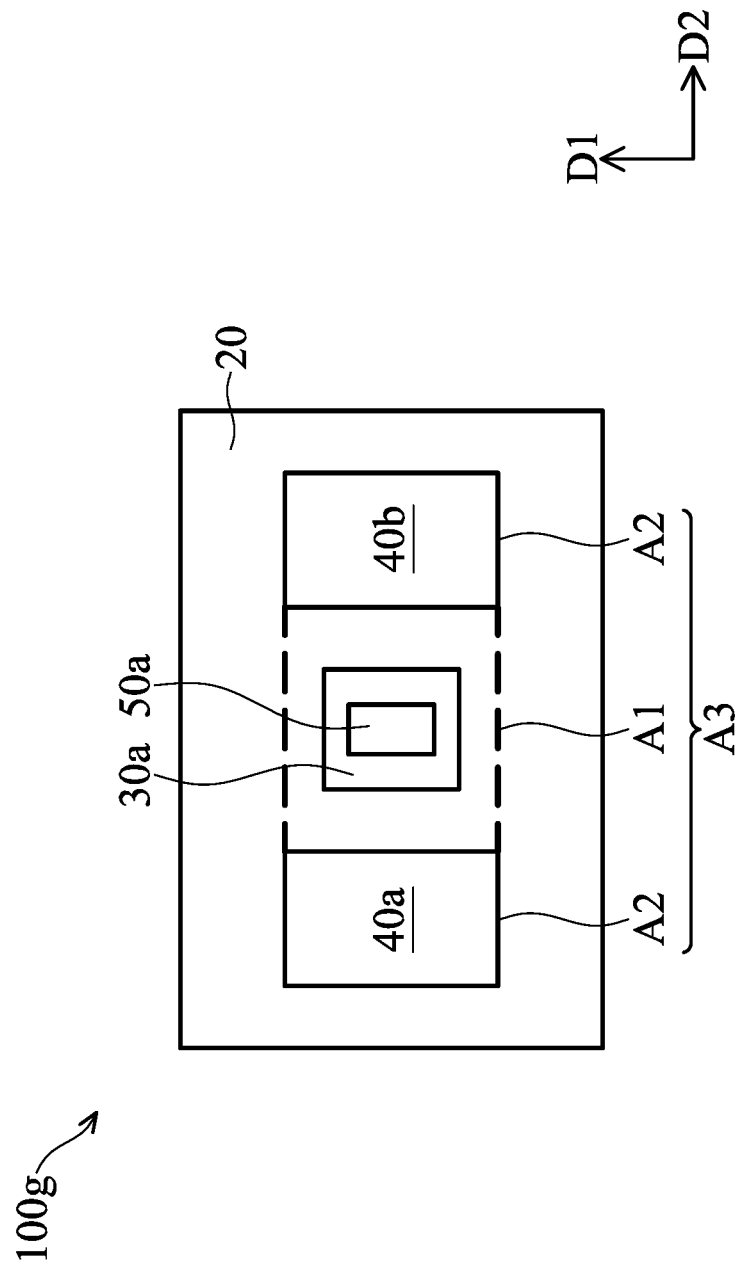
FIG. 7C is a bottom view of any one of the micro semiconductor devices 20 of FIG. 7A.

FIG. 7A is a top view showing a micro semiconductor structure 100g in accordance with one embodiment of the disclosure; FIG. 7B is a cross-sectional view of the micro semiconductor structure 100g taken along line A-A' of FIG. 7A; and FIG. 7C is a bottom view of any one of the micro semiconductor devices 20 of FIG. 7A (the substrate 10 is not shown).

The micro semiconductor structure 100g of FIG. 7A is similar to the micro semiconductor structure 100a of FIG. 1A. The difference between FIG. 7A and FIG. 1A is that, in the embodiment shown in the FIG. 7A, the micro semiconductor structure 100g further includes a plurality of second supporting layers 50a, and the second supporting layers 50a are disposed between the substrate 10 and the first supporting layers 30a. In addition, the orthographic projections of the first supporting layer 30a and the second supporting layer 50a on the substrate 10 are located in the orthographic projection of the first region A1 on the substrate 10, as shown in FIG. 7C. The second supporting layers 50a may include organic material (such as benzocyclobutene, phenol formaldehyde resin, epoxy resin, polyisoprene rubber), inorganic material (such as silicon oxide, silicon nitride, silicon oxynitride, or a combination thereof), or other thermal denatured materials (such as cold-short materials, hot melting materials, photoresist materials, or a combination thereof), or a combination thereof.

In some embodiments, the first supporting layer 30a may be formed and fixed on the lower surface 21 of the micro semiconductor device 20. Then, the second supporting layer 50a is formed and fixed under the first supporting layer 30a. Afterwards, the micro semiconductor device 20, the first supporting layer 30a and the second supporting layer 50a are placed on the substrate 10 to form the micro semiconductor structure 100g. Afterwards, the micro semiconductor device 20 can be firmly connected to the substrate 10 by fixing the substrate 10 under the second supporting layer 50a.

In other embodiments, the first supporting layer 30a may be formed and fixed on the lower surface 21 of the micro semiconductor device 20, and the second supporting layer 50a may be formed and fixed on the substrate 10. Then, the lower surface 21 and the first supporting layer 30a of the micro semiconductor device 20 face the substrate 10, and they are placed on the substrate 10 and the second supporting layer 50a to form the micro semiconductor structure 100g. Afterwards, the micro semiconductor device 20 can be firmly connected to the substrate 10 by fixing the second supporting layer 50a under the first supporting layer 30a.

In other embodiments, the second supporting layer 50a may be formed and fixed on the substrate 10, and then, the first supporting layer 30a may be formed and fixed on the second supporting layer 50a. Then, the lower surface 21 of the micro semiconductor device 20 faces the substrate 10, and the lower surface 21 of the micro semiconductor device 20 is placed on the substrate 10 to form the micro semiconductor structure 100g. Afterwards, the micro semiconductor device 20 can be firmly connected to the substrate 10 by fixing the first supporting layer 30a on the lower surface 21 of the micro semiconductor device 20.

In this embodiment, the orthographic projection of the second supporting layer 50a on the substrate 10 is completely located within the orthographic projection of the third region A3, which avoids occupying the space beside the side of the micro semiconductor device 20. Therefore, the micro semiconductor device 20 can be densely arranged on the substrate 10. More specifically, the second supporting layer 50a of this embodiment is completely located within the orthographic projection of the first region A1, and the second supporting layer 50a does not contact the first electrode 40a or the second electrode 40b to avoid damage caused by pressing the first electrode 40a and the second electrode 40b.

In this embodiment, the sum of the thickness of the first supporting layer 30a and the thickness of the second supporting layer 50a is greater than the thickness of the first electrode 40a or the thickness of the second electrode 40b. Therefore, the first supporting layer 30a and the second supporting layer 50a can be used together to elevate the micro semiconductor device 20 and to prevent the first electrode 40a and the second electrode 40b from contacting the substrate 10. As a result, it can prevent the substrate 10 from contacting the first electrode 40a and the second electrode 40b to cause damage, and the elevated micro semiconductor device 20 can also achieve better pickup in the process of transferring onto the receiving substrate.

In some embodiments, the orthographic projections of both the first supporting layer 30a and the second supporting layer 50a on the substrate 10 at least partially overlap the orthographic projection of the first region A1. Therefore, after the micro semiconductor device 20 is transferred, the subsequent high temperature process (for example, soldering) is performed under the condition that the first supporting layer 30a and the second supporting layer 50a are retained. In such embodiments, the first supporting layer 30a and the second supporting layer 50a may be used together as a blocking structure between the first electrode 40a and the second electrode 40b to prevent the first electrode 40a and the second electrode 40b which are in the molten state from contacting each other to cause short circuit.

In some embodiments, during the transferring process, the first supporting layer 30a and the second supporting layer 50a are retained, and the sum of the thickness of the first supporting layer 30a and the thickness of the second supporting layer 50a is greater than the thickness of the first electrode 40a or the thickness of the second electrode 40b. In such embodiments, the first supporting layer 30a and the second supporting layer 50a can be used as a buffer structure. When the micro semiconductor device 20 is transferred onto the receiving substrate, the second supporting layer 50a contacts the receiving substrate first, and the impact force is absorbed by the first supporting layer 30a and the second supporting layer 50a together to prevent the first electrode 40a and the second electrode 40b from directly colliding with the receiving substrate to cause damage.

In some embodiments, the orthographic projection of the second supporting layer 50a on the substrate 10 is located within the orthographic projection of the first supporting layer 30a on the substrate 10. Therefore, the contacting area between the first supporting layer 30a and the micro semiconductor device 20 is larger, so that the first supporting layer 30a can support the micro semiconductor device 20 more stably. On the other hand, the contacting area between the second supporting layer 50a and the substrate is smaller, so that the required pickup force is reduced when the micro semiconductor device 20 is picked up. In this embodiment, the width W1 of the first supporting layer 30a is greater than the width W2 of the second supporting layer 50a, as shown in FIG. 7B. Because the width W1 of the supporting layer 30a is large, the contacting area between the first supporting layer 30a and the micro semiconductor device 20 is large, so that the first supporting layer 30a can support the micro semiconductor device 20 more stably. On the other hand, because the width W2 of the second supporting layer 50a is small, the contacting area between the second supporting layer 50a and the substrate 10 is small to reduce the force to be overcome between the second supporting layer 50a and the substrate 10 during picking up the micro semiconductor device 20. In some embodiments, the ratio of the width W2 of the second supporting layer 50a to the width W1 of the first supporting layer 30a is greater than or equal to 0.5, and the ratio is less than or equal to 1. As a result, the sufficient fixing force between the first supporting layer 30a and the micro semiconductor device 20 can be achieved, and the reduced pickup force between the second supporting layer 50a and the substrate 10 during picking up the micro semiconductor device 20 can be also achieved.

In some embodiments, the second supporting layer 50a includes a thermal denatured material. The thermal denatured material may include a cold-short material, a hot melting material, a thermally volatile material, or a combination thereof. When the second supporting layer 50a is a cold-short material, before the micro semiconductor device 20 is picked up and transferred onto the receiving substrate, a cooling process may be performed on the second supporting layer 50a to embrittle the second supporting layer 50a to ensure that the second supporting layer 50a can be broken when the micro semiconductor device 20 is picked up. The cooling process can make the process for picking up and transferring the micro semiconductor device 20 become smoother and increase the success rate of the process for picking up and transferring the micro semiconductor device 20. The temperature of the cooling process may depend on the cold-short temperature of the cold-short material. The temperature of the cooling process may be, for example, from about −300° C. to about 0° C., or, for example, from about −100° C. to about −10° C.

In some embodiments, when the second supporting layer 50a is a hot melting material, before the micro semiconductor device 20 is transferred onto the receiving substrate, a heating process may be performed on the second supporting layer 50a to melt or volatilize the second supporting layer 50a to ensure that the second supporting layer 50a can be broken when the micro semiconductor device 20 is picked up. The heating process can make the process for picking up and transferring the micro semiconductor device 20 become smoother and increase the success rate of the process for picking up and transferring the micro semiconductor device 20. The temperature of the heating process may depend on the melting point temperature of the hot melting material. The temperature of the heating process may be, for example, from about 40° C. to about 300° C., or, for example, from about 50° C. to about 180° C.

In this embodiments, because the width of the second supporting layer 50a is smaller than the width of the first supporting layer 30a, compared with the situation where the first supporting layer 30a is a thermal denatured material, when the second supporting layer 50a includes a thermal denatured material, it is easier to break the second supporting layer 50a after the heating process or cooling process. In other words, the second supporting layer 50a is a thermal denatured material (for example, benzocyclobutene), and the first supporting layer 30a is a non-thermal denatured material (for example, silicon oxide) that is not affected by temperature. After the heating process or cooling process is performed, it is possible to ensure that the second supporting layer 50a is broken when the micro semiconductor devices 20 are transferred, and to prevent the second supporting layer 50a from interfering with the electrical properties of the first electrode 40a and the second electrode 40b. Furthermore, the first supporting layer 30a can be retained between the first electrode 40a and the second electrode 40b, and it can be used as a blocking structure for the subsequent bonding process, but the present invention is not limited thereto.

In other embodiments, the first supporting layer 30a is a thermal denatured material (for example, benzocyclobutene), and the second supporting layer 50a is a non-thermal denatured material (for example, silicon oxide). Therefore, after the heating process or cooling process is performed, it is possible to ensure that the first supporting layer 30a is broken and at least a part of the first supporting layer 30a and the second supporting layer 50a below it are removed when the micro semiconductor element 20 is transferred. In other embodiments, the first supporting layer 30a and the second supporting layer 50a are both thermal denatured materials.

In this embodiment, the Young's modulus of the first supporting layer 30a is smaller than the Young's modulus of the second supporting layer 50a, so the rigidity of the first supporting layer 30a is smaller than the rigidity of the second supporting layer 50a, and the tenacity of the first supporting layer 30a is greater than the tenacity of the second supporting layer 50a. When the first supporting layer 30a has greater tenacity, it can effectively provide a good buffering ability between the micro semiconductor device 20 and the second supporting layer 50a to prevent the first supporting layer 30a from cracking due to the external force while fixing and supporting the micro semiconductor element 20. When the micro semiconductor device 20 has larger rigidity, the micro semiconductor device 20 can be effectively fixed and supported. In this embodiment, the composite structure formed by the first supporting layer 30a and the second supporting layer 50a can provide a good fixing and supporting effect and avoid cracking to facilitate the transfer of the micro semiconductor device 20 between different substrates.

Figure 8A:
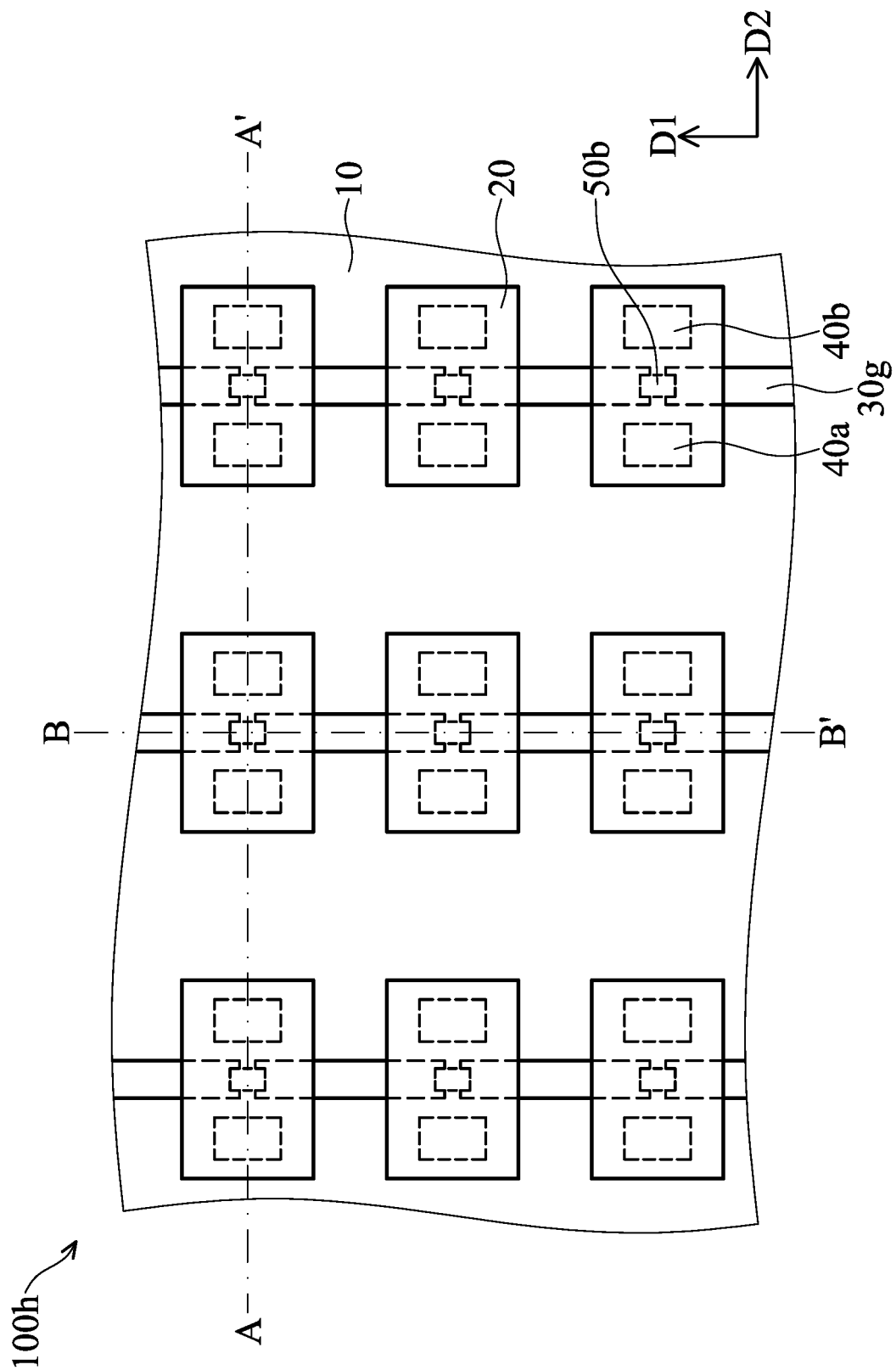
FIG. 8A is a top view showing a micro semiconductor structure 100h in accordance with some embodiments of the disclosure.
Figure 8B:
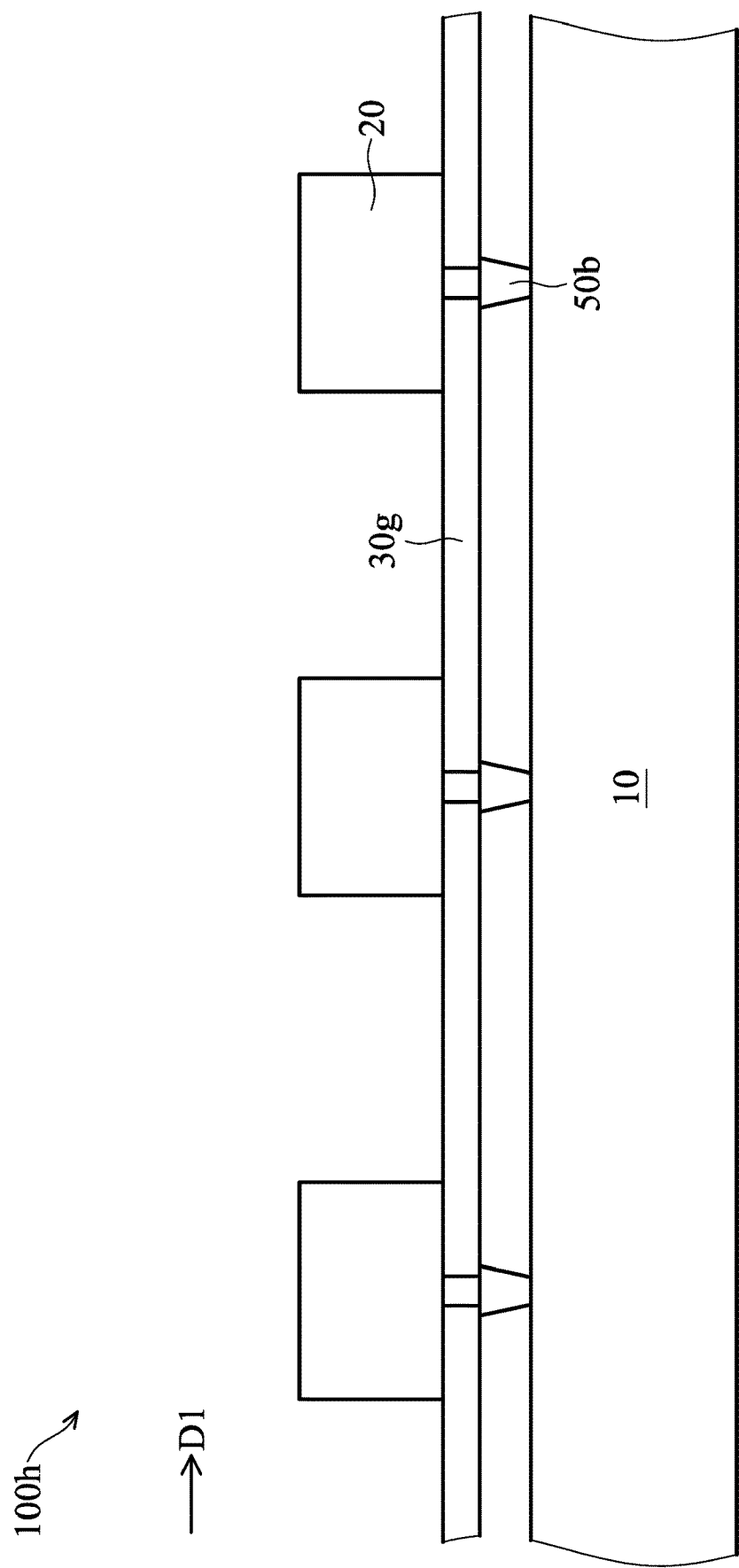
FIG. 8B is a cross-sectional view of the micro semiconductor structure 100h taken along line B-B' of FIG. 8A.
Figure 8C:
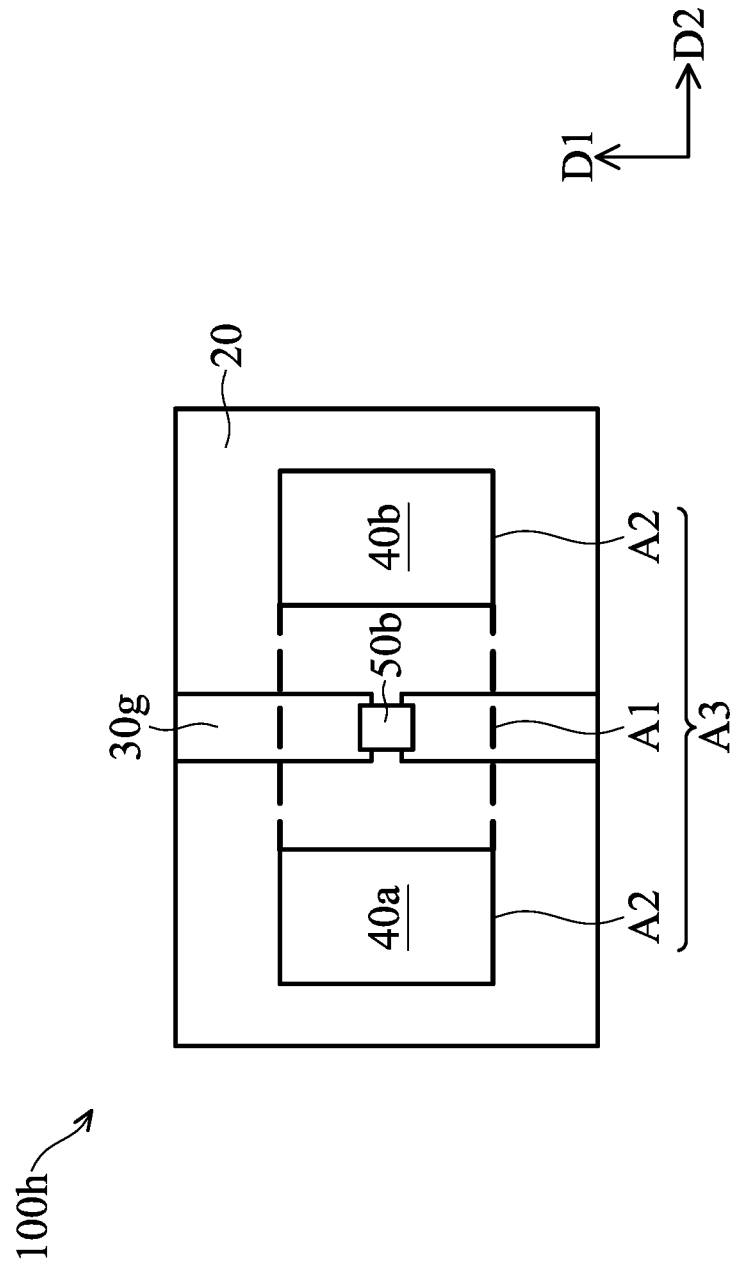
FIG. 8C is a bottom view of any one of the micro semiconductor devices 20 of FIG. 8A.

FIG. 8A is a top view showing a micro semiconductor structure 100h in accordance with some embodiments of the disclosure; FIG. 8B is a cross-sectional view of the micro semiconductor structure 100h taken along line B-B' of FIG. 8A; and FIG. 8C is a bottom view of any one of the micro semiconductor devices 20 of FIG. 8A (the substrate 10 is not shown).

The micro semiconductor structure 100h of FIG. 8A is similar to the micro semiconductor structure 100g of FIG. 7A. The difference between FIG. 8A and FIG. 7A is that, in the embodiment shown in the FIG. 8A, the second supporting layer 50b has a shape which has a greater top width and a smaller bottom width, and the thickness of the first supporting layer 30g is smaller than the thickness of the first electrode 40a or the thickness of the second electrode 40b, as shown in FIG. 8B. Another difference between FIG. 8A and FIG. 7A is that, in the embodiment shown in the FIG. 8A, the second supporting layer 50b is located within the orthographic projection of the first region A1, and the orthographic projections of the adjacent first supporting layers 30g do not contact each other to form a plurality of discontinuous first supporting layers 30e, as shown in FIG. 8C.

Although the thickness of the first supporting layer 30g in this embodiment is smaller than the thickness of the first electrode 40a or the thickness of the second electrode 40b, the sum of the thickness of the first supporting layer 30g and the thickness of the second supporting layer 50b is still greater than the thickness of the first electrode 40a or the thickness of the second electrode 40b. Therefore, the first supporting layer 30g and the second supporting layer 50b together can still elevate the micro semiconductor device 20, and the first electrode 40a and the second electrode 40b do not contact the substrate 10 to prevent the substrate 10 from contacting the first electrode 40a and the second electrode 40b to cause damage. The elevated micro semiconductor device 20 can also achieve better pickup in the process of transferring onto the receiving substrate.

In this embodiment, because the second supporting layer 50b has a shape which has a greater top width and a smaller bottom width, the top surface of the second supporting layer 50b has a larger area than the bottom surface. Therefore, the first supporting layer 30g can be stably supported. Furthermore, the contacting area between the second supporting layer 50b and the substrate 10 is smaller than the area of the top surface of the second supporting layer 50b, which reduces the pickup force required in the process of transferring the micro semiconductor device 20.

Figure 9:
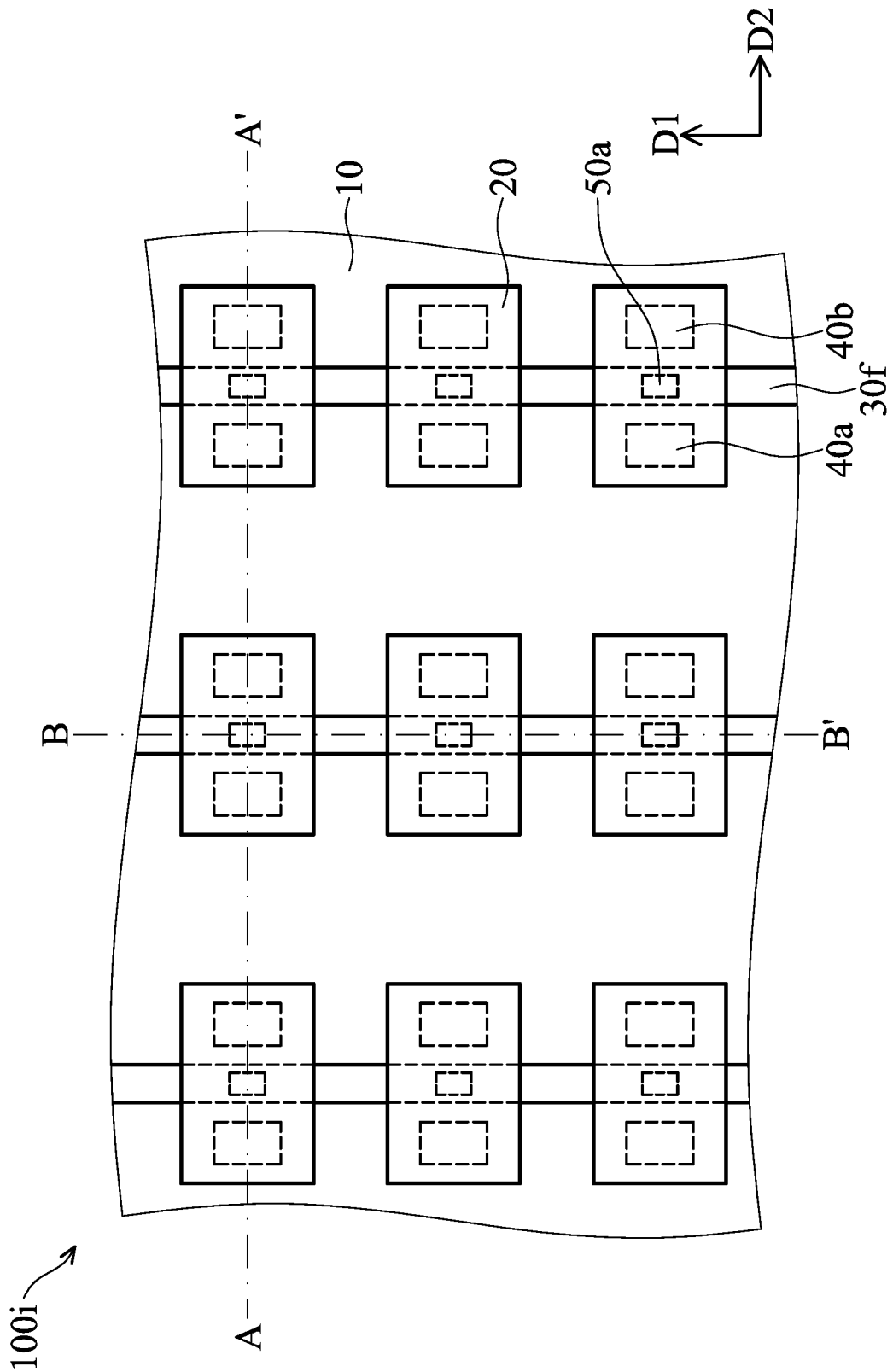
FIG. 9 is a top view showing a micro semiconductor structure 100i in accordance with one embodiment of the disclosure.

FIG. 9 is a top view showing a micro semiconductor structure 100i in accordance with one embodiment of the disclosure.

The micro semiconductor structure 100i of the embodiment of FIG. 9 is similar to the structure that the second supporting layer 50a of FIG. 7A is disposed between the first supporting layer 30f and the substrate 10 of the embodiment of FIG. 6A. In this embodiment, the plurality of first supporting layers 30f have a continuous structure. Therefore, the first supporting layer 30f can effectively fix and support the micro semiconductor element 20, and it is more easily separated from the second supporting layer 50a during subsequent picking process. As a result, the efficiency and yield of the process are improved.

Figure 10A:
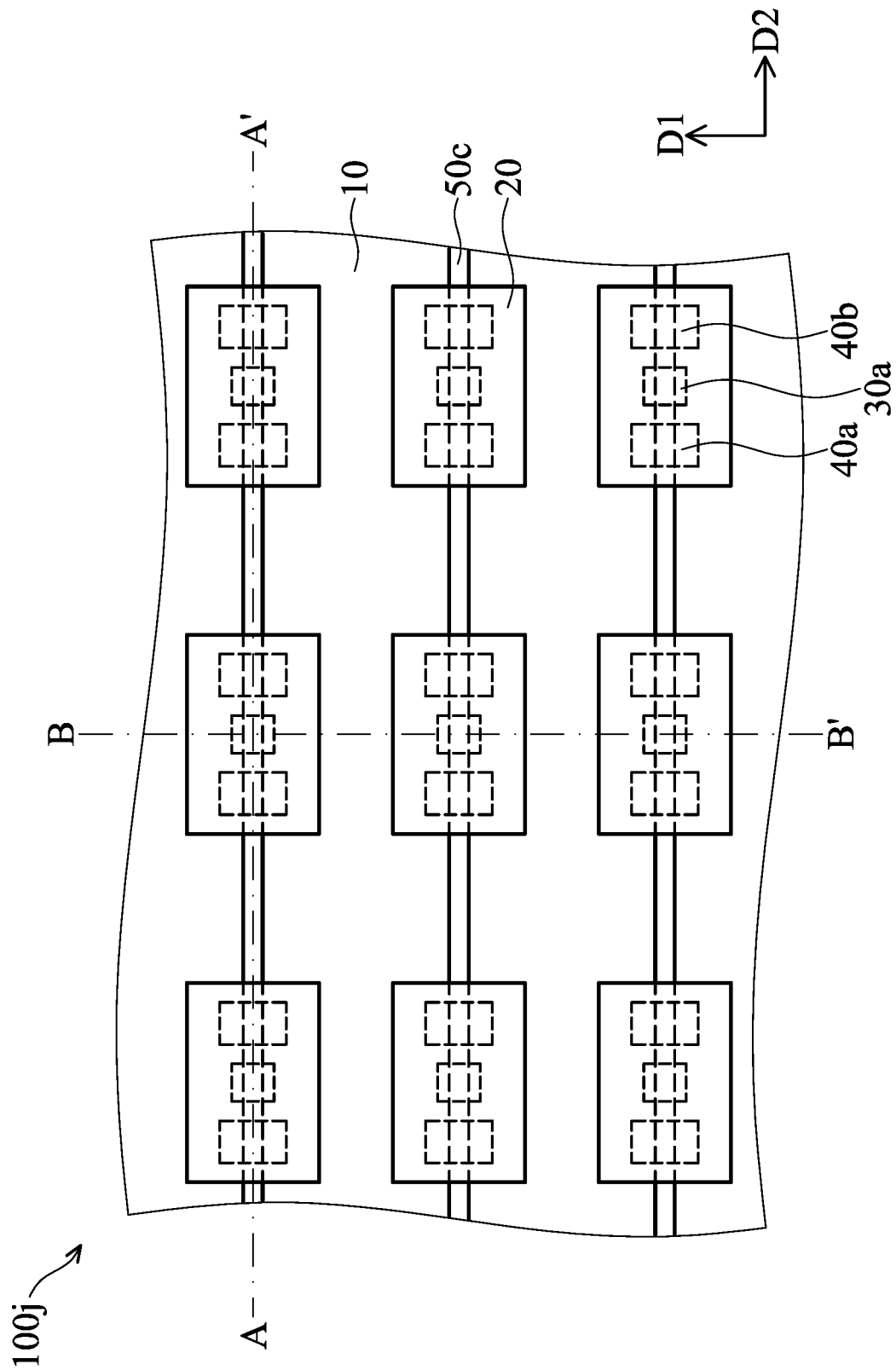
FIG. 10A is a top view showing a micro semiconductor structure 100j in accordance with some embodiments of the disclosure.
Figure 10B:
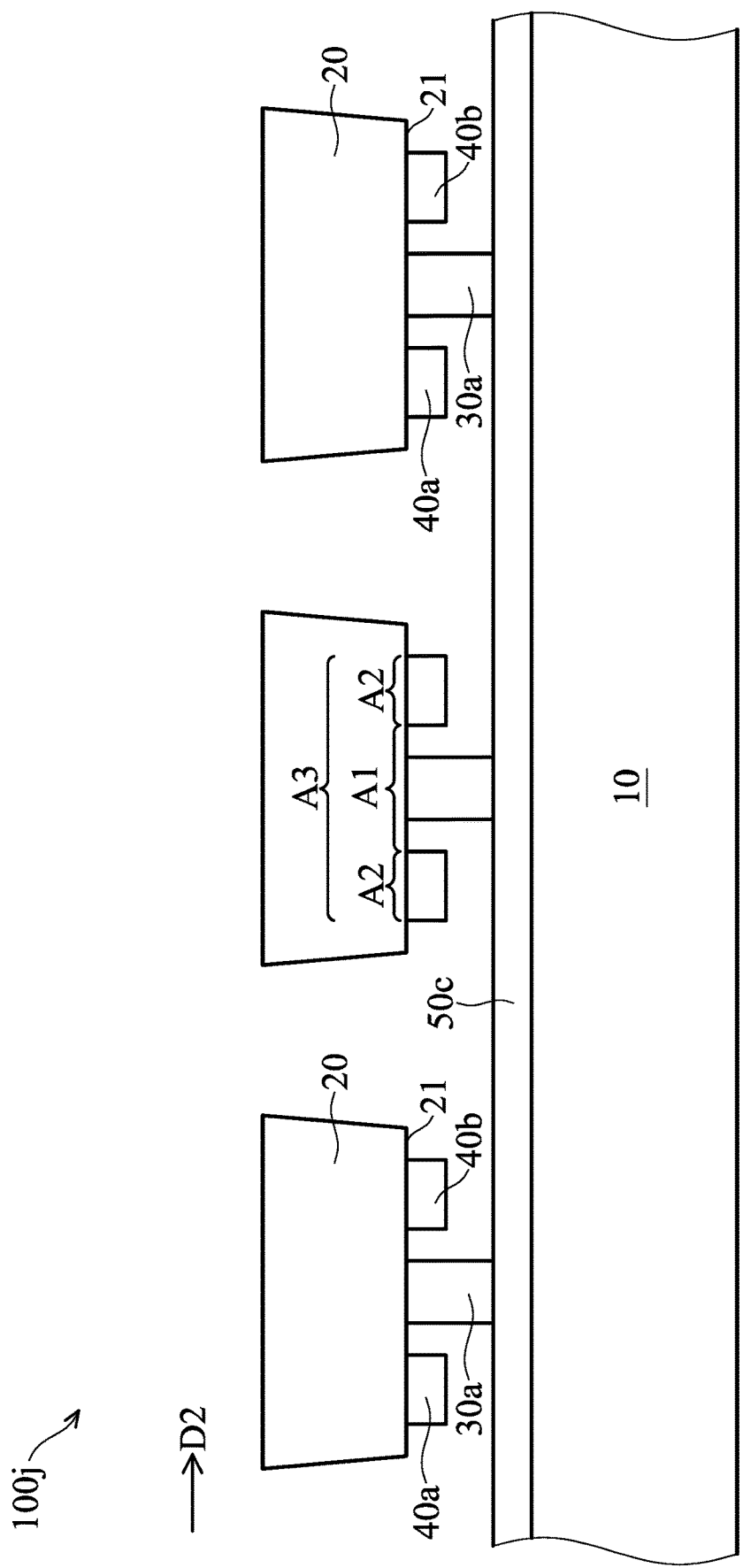
FIG. 10B is a cross-sectional view of the micro semiconductor structure 100j taken along line A-A' of FIG. 10A.
Figure 10C:
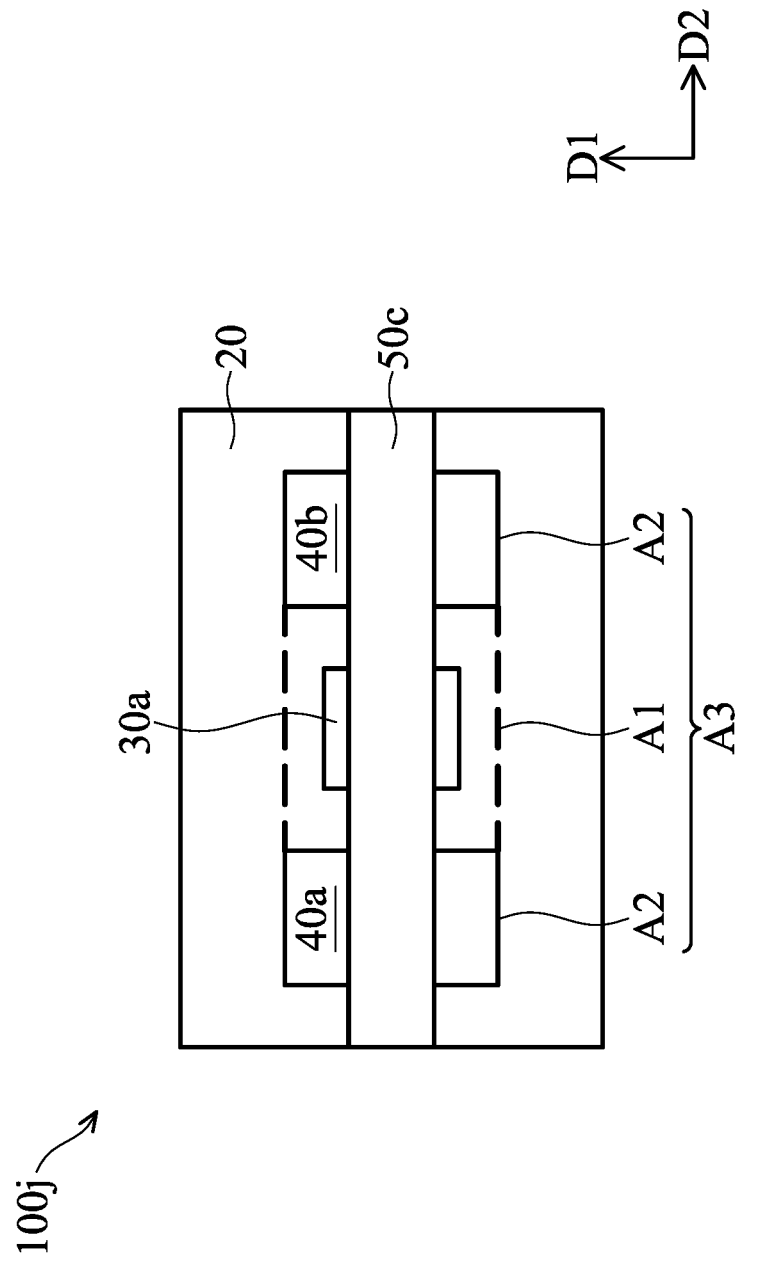
FIG. 10C is a bottom view of any one of the micro semiconductor devices 20 of FIG. 10A.

FIG. 10A is a top view showing a micro semiconductor structure 100j in accordance with some embodiments of the disclosure; FIG. 10B is a cross-sectional view of the micro semiconductor structure 100j taken along line A-A' of FIG. 10A; and FIG. 10C is a bottom view of any one of the micro semiconductor devices 20 of FIG. 10A (the substrate 10 is not shown).

The micro semiconductor structure 100j of FIG. 10A is similar to the micro semiconductor structure 100g of FIG. 7A. The difference between FIG. 10A and FIG. 7A is that, in the embodiment shown in the FIG. 10A, the orthographic projection of the second supporting layer 50c of the embodiment of FIG. 10A extends outward along the second direction D2 from the orthographic projection of the third region A3 to the outside of the orthographic projection of third region A3, and it spans the orthographic projection of the adjacent micro semiconductor devices 20 to form the continuous structure along the second direction D2, as shown in FIGS. 10B and 10C.

In this embodiment, the second supporting layer 50c is a continuous structure spanning the adjacent micro semiconductor devices 20. Therefore, the second supporting layer 50c can effectively fix and support the micro semiconductor element 20, and it is more easily detached from the first supporting layer 30a in the subsequent picking process. As a result, the efficiency and yield of the process are improved.

In this embodiment, the second supporting layer 50c only extends in the space which is below the adjacent micro semiconductor devices 20 in the second direction D2, but does not occupy the space beside the sidewalls of the adjacent micro semiconductor devices 20, so that the micro semiconductor devices 20 can be densely arranged on the substrate 10.

Figure 11A:
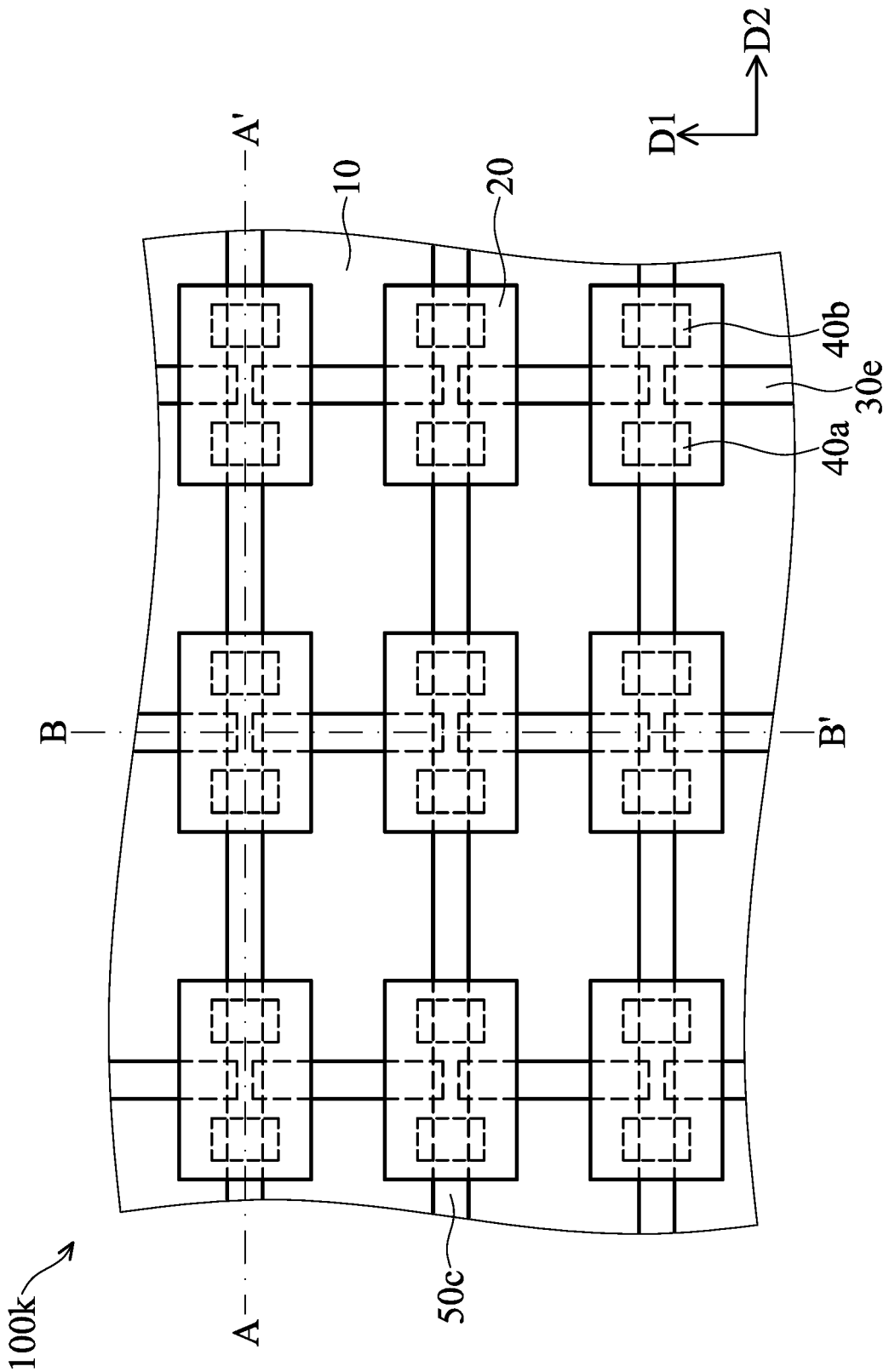
FIG. 11A is a top view showing a micro semiconductor structure 100k in accordance with some embodiments of the disclosure.
Figure 11B:
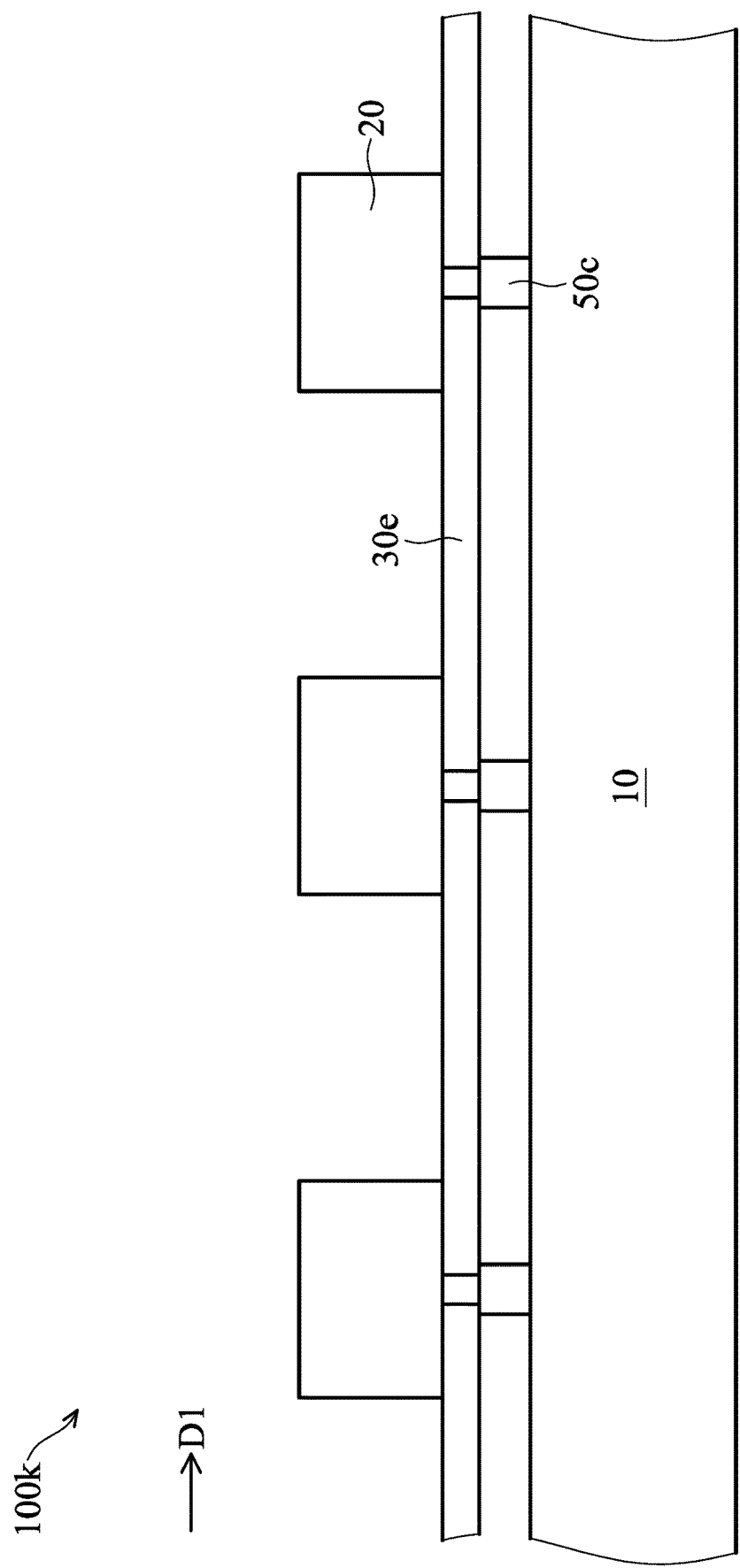
FIG. 11B is a cross-sectional view of the micro semiconductor structure 100k taken along line B-B' of FIG. 11A.

FIG. 11A is a top view showing a micro semiconductor structure 100k in accordance with some embodiments of the disclosure; FIG. 11B is a cross-sectional view of the micro semiconductor structure 100k taken along line B-B' of FIG. 11A; and FIG. 11C is a bottom view of any one of the micro semiconductor devices 20 of FIG. 11A (the substrate 10 is not shown).

The micro semiconductor structure 100k of the embodiment of FIG. 11A is similar to the structure that the second supporting layer 50c of FIG. 10A is disposed between the first supporting layer 30e and the substrate 10 of the embodiment of FIG. 5A.

Figure 11C:
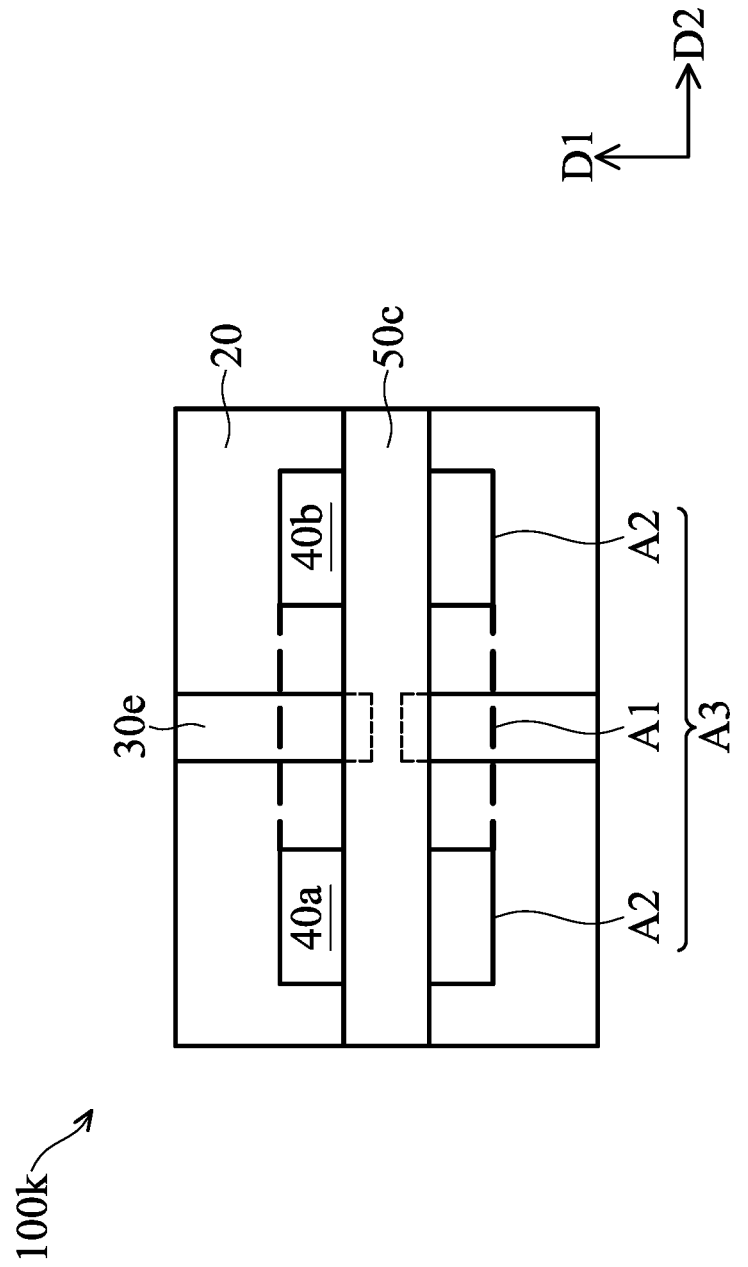
FIG. 11C is a bottom view of any one of the micro semiconductor devices 20 of FIG. 11A.

Compared with the embodiments of FIG. 5A and FIG. 10A, both the orthographic projection of the first supporting layer 30e and the orthographic projection of the second supporting layer 50c of the embodiment of FIG. 11A extend outward from the orthographic projection of the third region A3 to the outside of the orthographic projection of third region A3, as shown in FIGS. 11B and 11C. More specifically, the first supporting layer 30e is a plurality of discontinuous structures connecting adjacent micro semiconductor devices 20, and the second supporting layer 50c is a continuous structure spanning a plurality of micro semiconductor devices 20. Therefore, compared with the embodiments of FIGS. 5A and 10A, the first supporting layer 30e and the second supporting layer 50c are disposed in different directions. Therefore, the first supporting layer 30e and the second supporting layer 50c can more stably support and fix the micro semiconductor device 20 on the substrate 10. As a result, the efficiency and yield of the process are improved.

Figure 12:
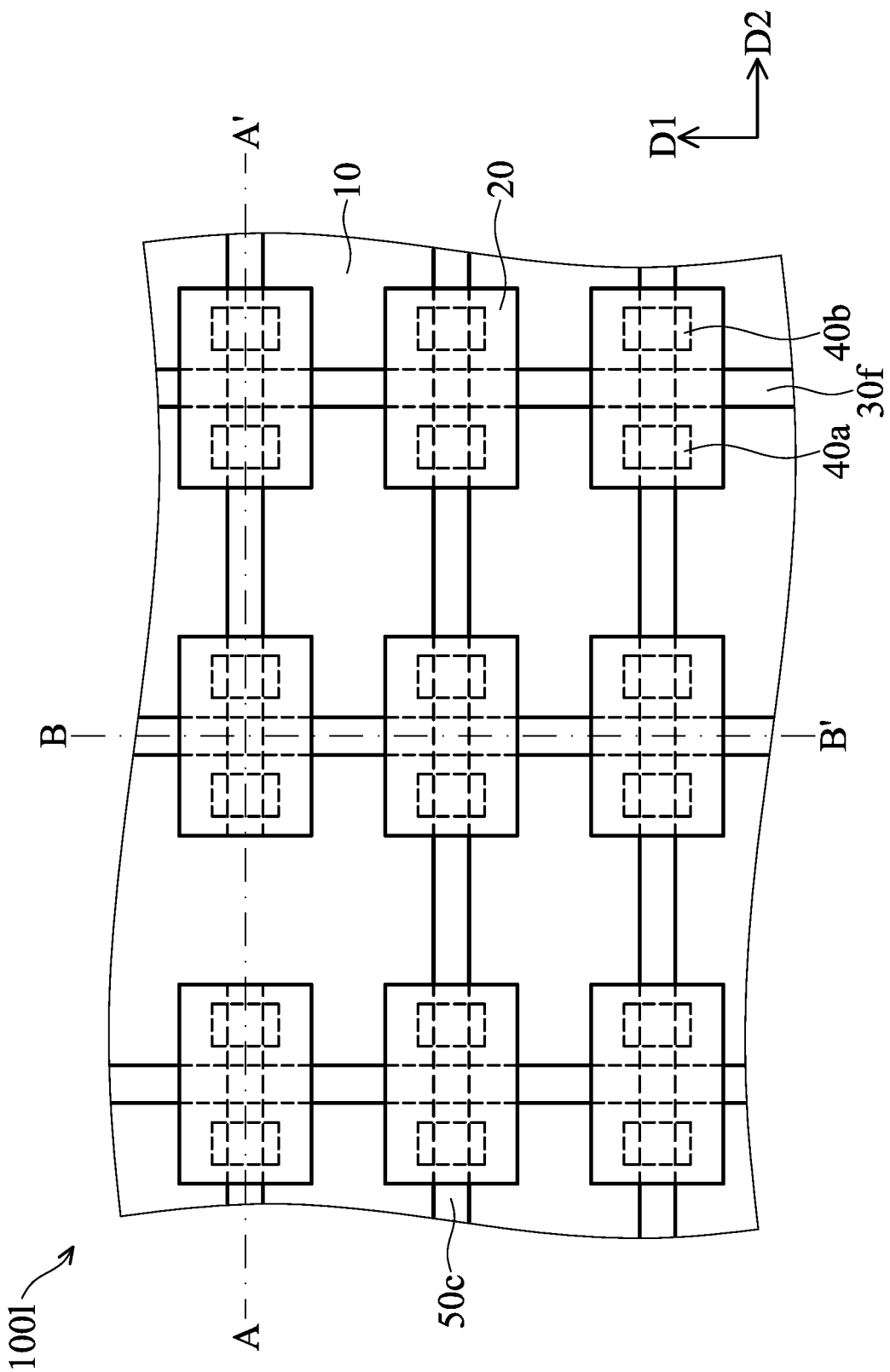
FIG. 12 is a top view showing a micro semiconductor structure 100l in accordance with some embodiments of the disclosure.

FIG. 12 is a top view showing a micro semiconductor structure 100l in accordance with some embodiments of the disclosure.

The micro semiconductor structure 100l of FIG. 12 is similar to the structure that the second supporting layer 50c of FIG. 10A is disposed between the first supporting layer 30f and the substrate 10 of the embodiment of FIG. 6A.

In this embodiment, both the first supporting layer 30f and the second supporting layer 50c are continuous structures spanning the plurality of micro semiconductor elements 20, and they are disposed in different directions. Therefore, the first supporting layer 30f and the second supporting layer 50c can stably support and fix the micro semiconductor device 20 on the substrate 10. As a result, the efficiency and yield of the process are improved.

Figure 13A:
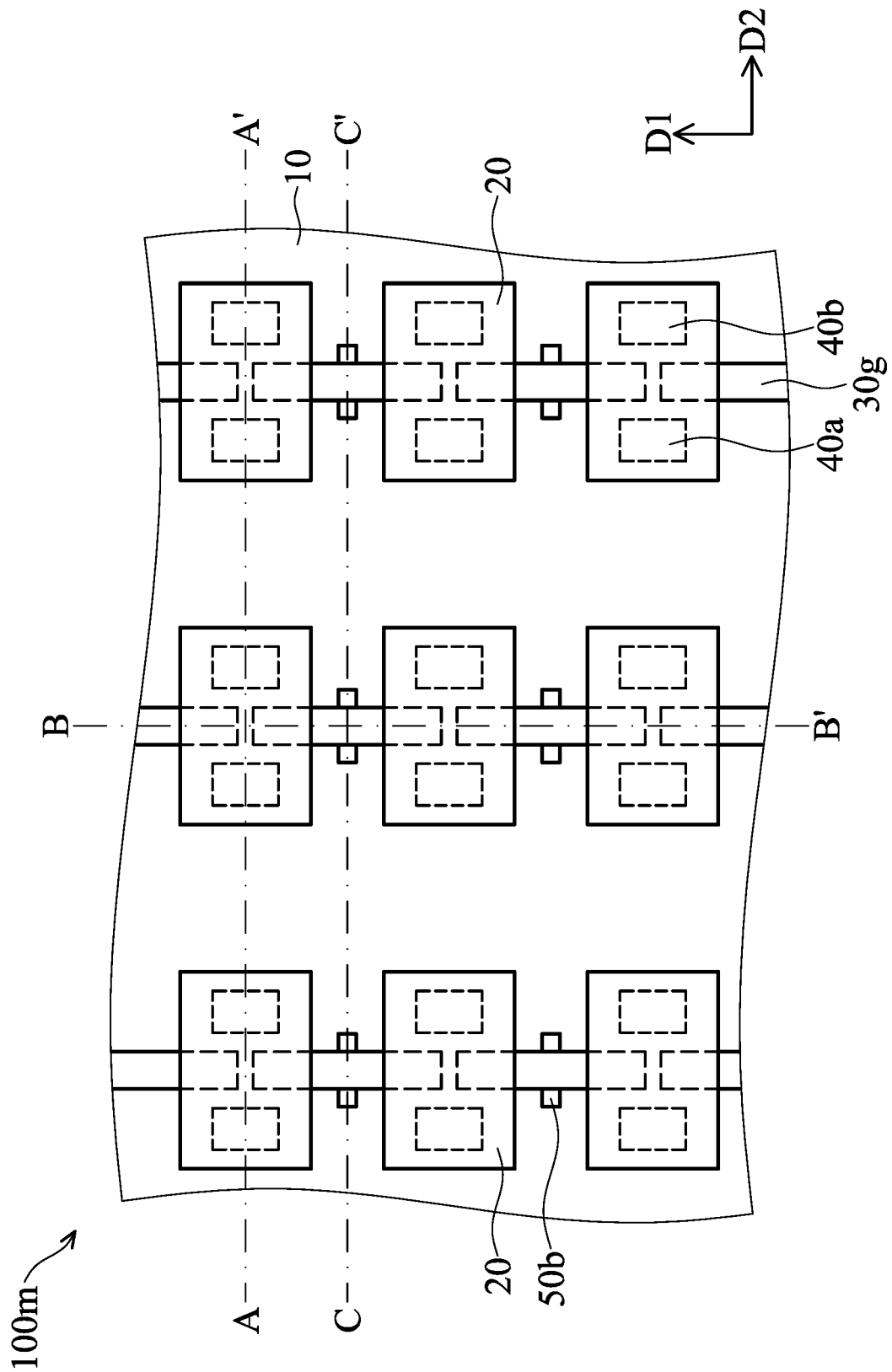
FIG. 13A is a top view showing a micro semiconductor structure 100m in accordance with some embodiments of the disclosure.
Figure 13B:
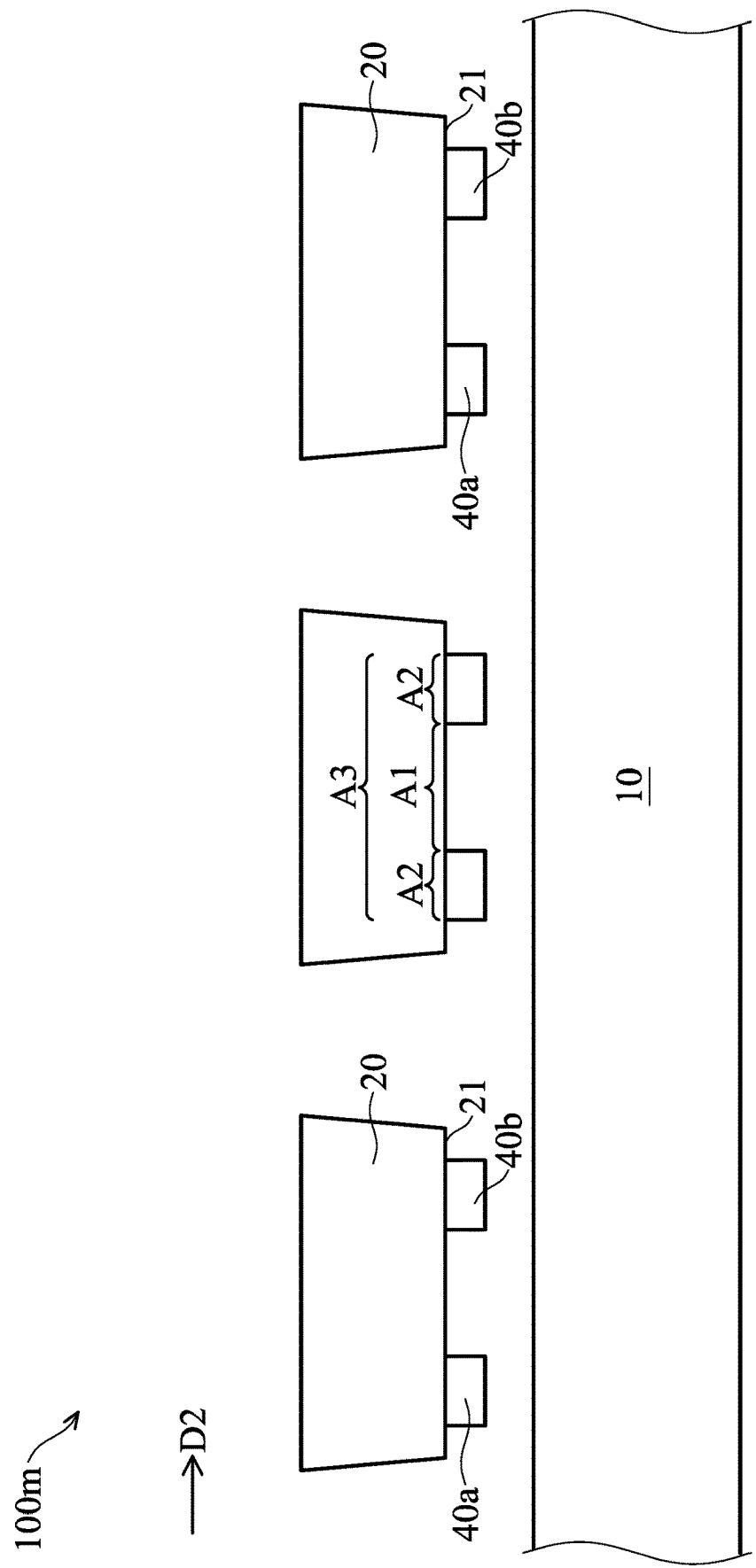
FIG. 13B is a cross-sectional view of the micro semiconductor structure 100m taken along line A-A' of FIG. 13A.
Figure 13C:
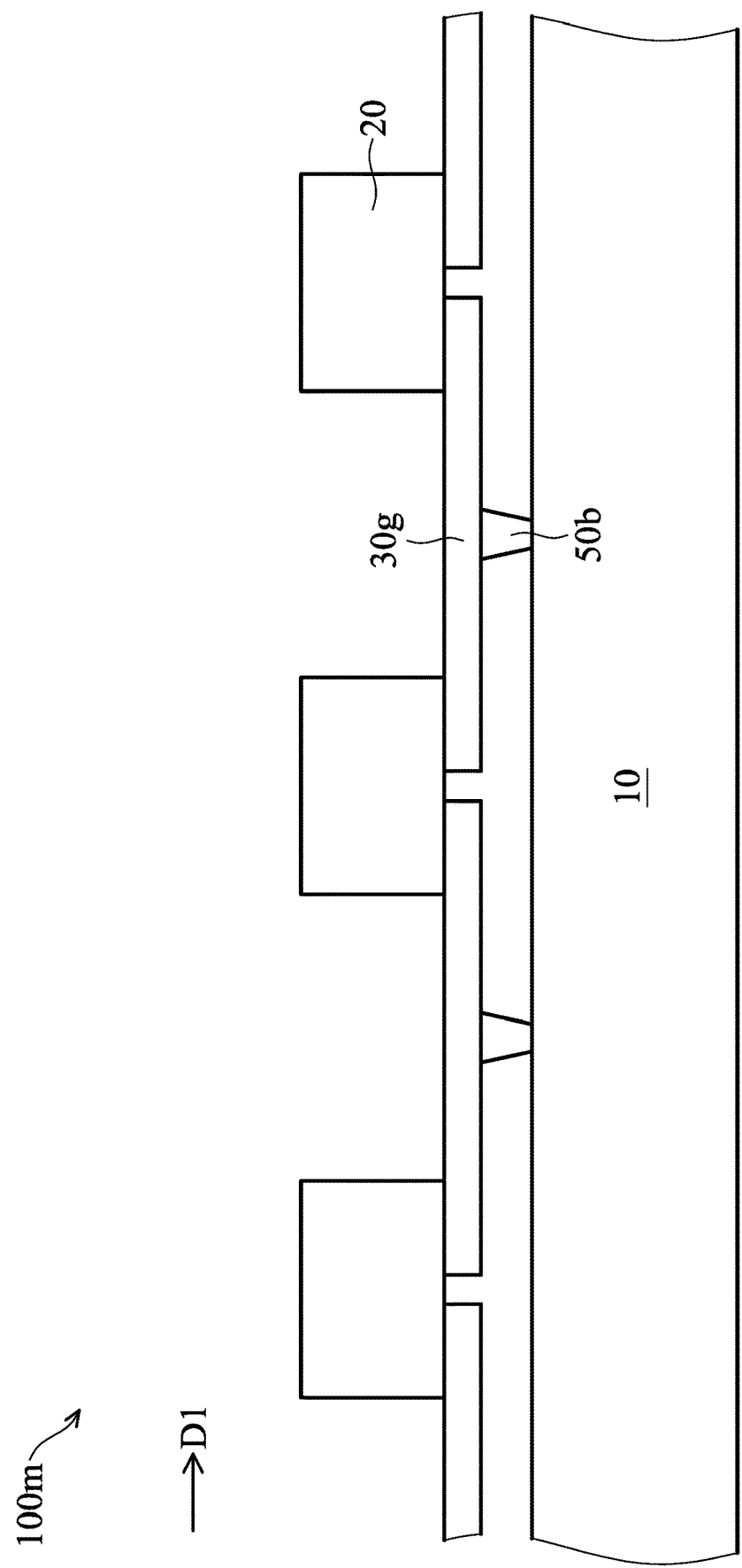
FIG. 13C is a cross-sectional view of the micro semiconductor structure 100m taken along line B-B' of FIG. 13A.
Figure 13D:
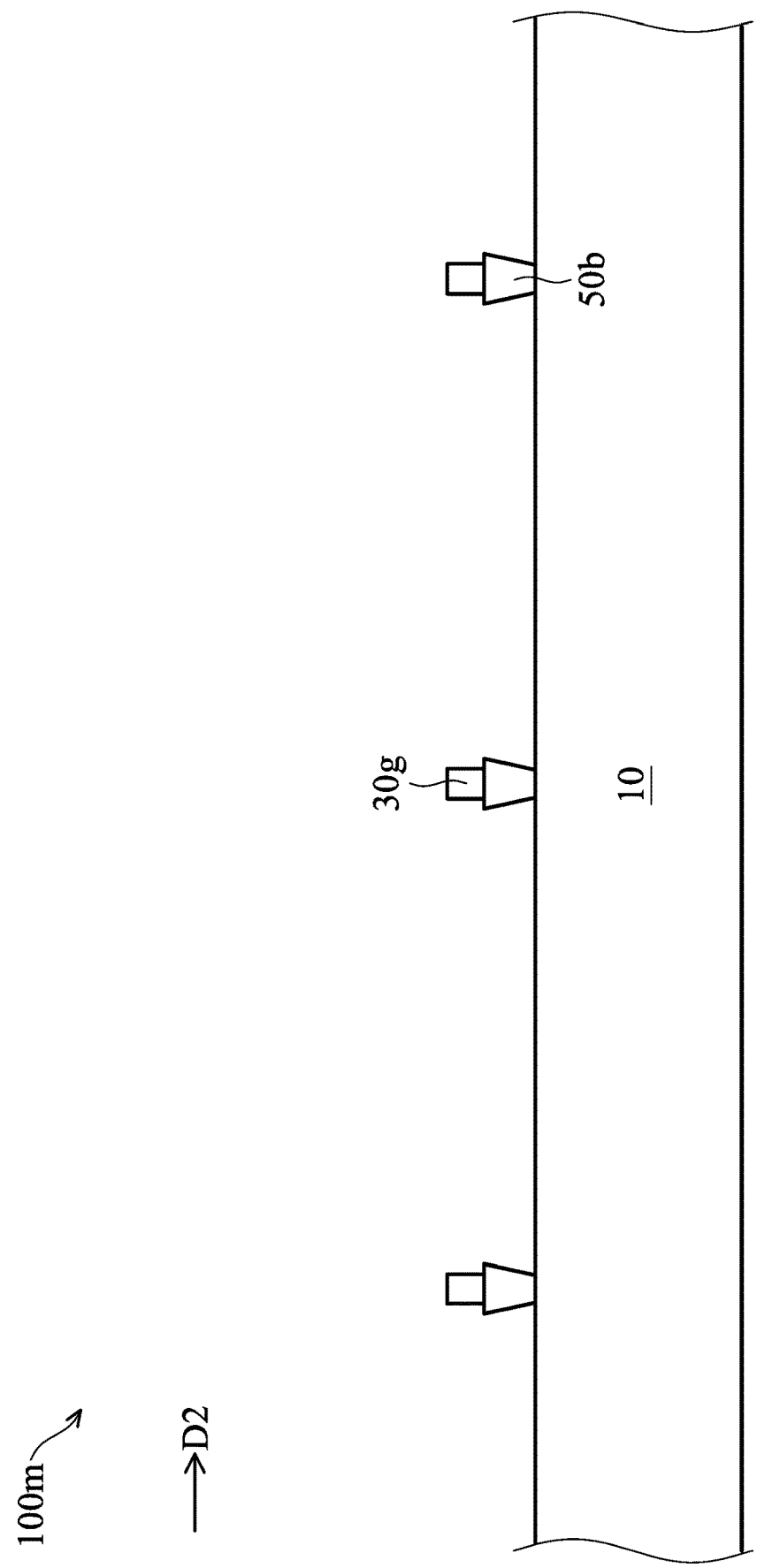
FIG. 13D is a bottom view of any one of the micro semiconductor devices 20 of FIG. 13A.

FIG. 13A is a top view showing a micro semiconductor structure 100m in accordance with some embodiments of the disclosure; FIG. 13B is a cross-sectional view of the micro semiconductor structure 100m taken along line A-A' of FIG. 13A; FIG. 13C is a cross-sectional view of the micro semiconductor structure 100m taken along line B-B' of FIG. 13A; and FIG. 13D is a bottom view of any one of the micro semiconductor devices 20 of FIG. 13A. The micro semiconductor structure 100m of FIG. 13A is similar to the micro semiconductor structure 100h of FIG. 8A. The difference between FIG. 13A and FIG. 8A is that, in the embodiment shown in the FIG. 13A, the second supporting layer 50b is not disposed directly under the micro semiconductor devices 20, but is disposed between the adjacent micro semiconductor devices 20. Therefore, the orthographic projection of the second supporting layer 50b is adjacent between the orthographic projections of the adjacent micro semiconductor devices 20.

Figure 14:
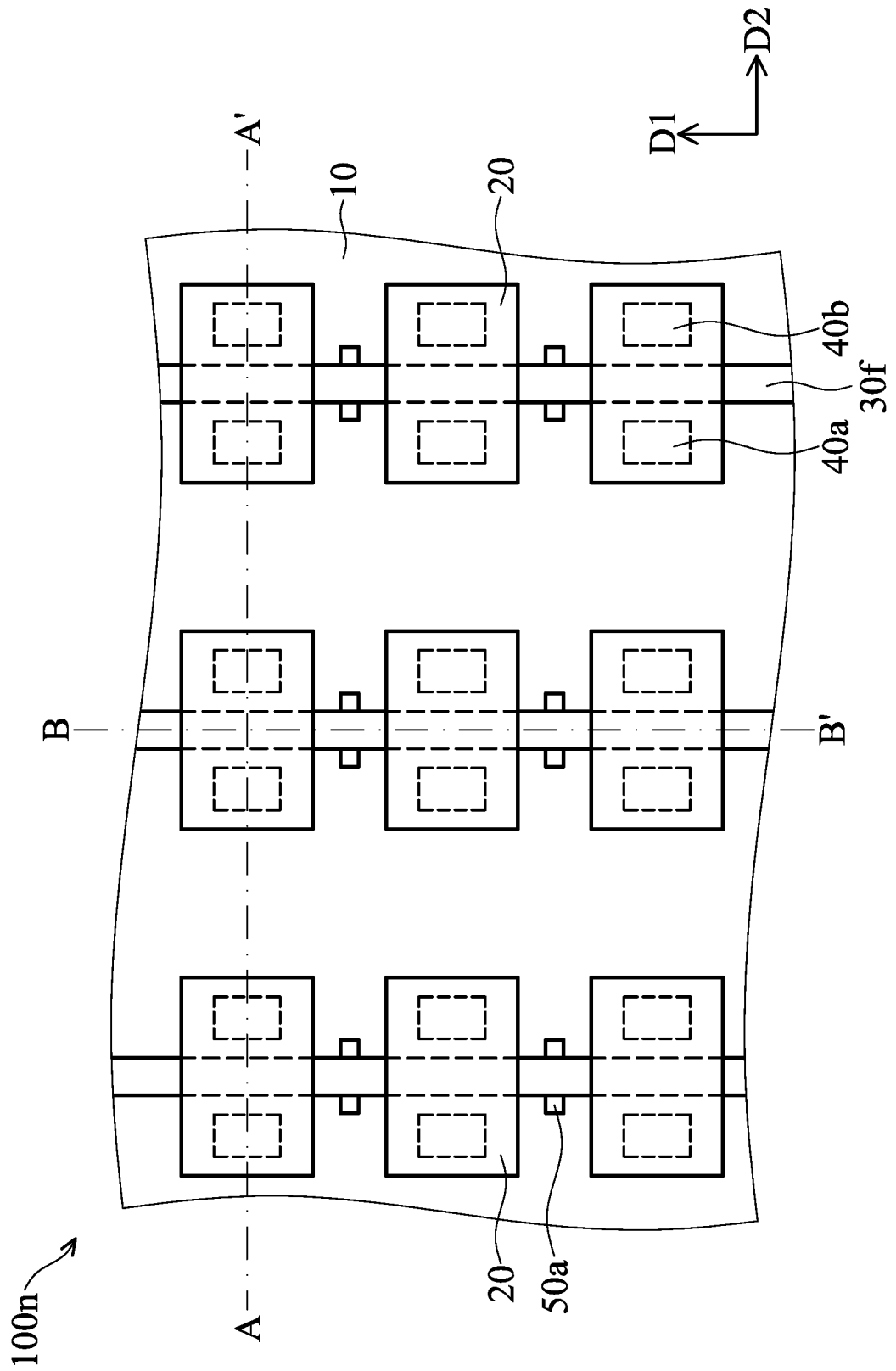
FIG. 14 is a top view showing a micro semiconductor structure 100n in accordance with some embodiments of the disclosure.

FIG. 14 is a top view showing a micro semiconductor structure 100n in accordance with some embodiments of the disclosure. The micro semiconductor structure 100n of FIG. 14 is similar to the micro semiconductor structure 100m of FIG. 13A. The difference between FIG. 14 and FIG. 13A is that, in the embodiment shown in the FIG. 14, the first supporting layer 50h of the embodiment of FIG. 14 is a continuous structure spanning a plurality of micro semiconductor devices 20, and it can more stably support and fix the micro semiconductor devices 20 on the substrate 10.

In accordance with some embodiments of the present invention, the micro-semiconductor devices 20 may be subsequently transferred, integrated and assembled into a variety of illumination or display applications, such as a micro LED display. The micro LED display may include other components depending on its application. These other components include (but are not limited to): memory, touch panel controllers, and batteries. In other embodiments, the micro LED display may be a television, tablet computer, cell phone, laptop computer, computer monitor, stand-alone terminal server, digital camera, handheld game console, media display, electronics book display, car display or large area electronic board display.

In addition, compared with the general LED technology, the dimension of the micro semiconductor device 20 is reduced from the millimeter level to the micron level, and therefore the micro semiconductor device 20 of the present disclosure is transferred and integrated and assembled to obtain a micro LED display. The resulted micro LED display can achieve high resolution and reduce the power consumption of display, and therefore, it has advantages of energy-saving, simple mechanism, thin and so on.

In summary, the micro semiconductor structure of the embodiments of the present invention has a first supporting layer disposed between the substrate and the micro semiconductor device. The first supporting layer can elevate the micro semiconductor device and is helpful to pick up the micro semiconductor device. The micro semiconductor structure may further include a second supporting layer disposed between the substrate and the first supporting layer to support the micro semiconductor device more stably. In addition, the first supporting layer and the second supporting layer do not occupy the space beside the sidewalls of the micro semiconductor device, so that the micro semiconductor device can be densely arranged on the substrate.

In addition, when the micro semiconductor device is transferred onto the receiving substrate, the first supporting layer or the second supporting layer can buffer the impact force generated by the receiving substrate to the electrode, and during the subsequent high temperature process (for example, soldering), the first supporting layer or the second supporting layer can also serve as a blocking structure between the electrodes to prevent the electrodes which are in the molten state from contacting each other to cause short circuit.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A micro semiconductor structure, comprising:
    a substrate;
    a plurality of micro semiconductor devices disposed on the substrate, wherein each of the micro semiconductor devices has a first electrode and a second electrode disposed on a lower surface of the micro semiconductor devices, the lower surface includes a region, wherein the region is between the first electrode and the second electrode;
    a plurality of first supporting layers disposed between the substrate and the micro semiconductor devices, wherein an orthographic projection of the first supporting layers on the substrate at least overlaps an orthographic projection of a portion of the region on the substrate, and the first supporting layers directly contacts the region; and
    an air gap located between the first electrode and the substrate and between the second electrode and the substrate.

2. The micro semiconductor structure as claimed in claim 1, wherein the orthographic projection of the first supporting layer on the substrate is located within the orthographic projection of the region on the substrate.

3. The micro semiconductor structure as claimed in claim 1, wherein the orthographic projection of the first supporting layer extends outward along the first direction from the orthographic projection of the region to the outside of the orthographic projection of the region.

4. The micro semiconductor structure as claimed in claim 3, wherein the orthographic projection of the first supporting layer on the substrate extends outward along the first direction from the orthographic projection of the region to the orthographic projection of the region of the adjacent micro semiconductor device.

5. The micro semiconductor structure as claimed in claim 4, wherein in the orthographic projection of the region, the orthographic projections of the adjacent first supporting layers do not contact each other to form a plurality of discontinuous first supporting layers.

6. The micro semiconductor structure as claimed in claim 4, wherein in the orthographic projection of the region, the orthographic projections of the adjacent first supporting layers contact each other to form a continuous structure.

7. The micro semiconductor structure as claimed in claim 1, further comprising:
    a plurality of second supporting layers disposed between the substrate and the first supporting layers.

8. The micro semiconductor structure as claimed in claim 7, wherein an orthographic projection of the second supporting layer on the substrate is located within the orthographic projection of the region.

9. The micro semiconductor structure as claimed in claim 7, wherein an orthographic projection of the second supporting layer extends outward from the orthographic projection of the region along a second direction and spans the orthographic projections of the adjacent micro semiconductor devices, wherein the second direction is different from a first direction.

10. The micro semiconductor structure as claimed in claim 7, wherein an orthographic projection of the second supporting layer is between the orthographic projections of the adjacent micro semiconductor devices.

11. The micro semiconductor structure as claimed in claim 7, wherein an orthographic projection of the second supporting layer on the substrate does not overlap an orthographic projection of the first electrode or an orthographic projection of the second electrode on the substrate.

12. The micro semiconductor structure as claimed in claim 7, wherein a Young's modulus of the first supporting layer is smaller than a Young's modulus of the second supporting layer.

13. The micro semiconductor structure as claimed in claim 7, wherein a sum of a thickness of any one of the first supporting layers and a thickness of any of the second supporting layers is greater than a thickness of the first electrode or a thickness of the second electrode.

14. The micro semiconductor structure as claimed in claim 7, wherein an orthographic projection of any one of the second supporting layers on the substrate is located within the orthographic projection of any one of the first supporting layers on the substrate.

15. The micro semiconductor structure as claimed in claim 1, wherein the orthographic projection of the first supporting layer on the substrate does not overlap an orthographic projection of the first electrode or an orthographic projection of the second electrode on the substrate.

16. The micro semiconductor structure as claimed in claim 15, wherein a ratio of a width of the first supporting layer to a width of the region is smaller than 1 and greater than or equal to 0.1.

17. The micro semiconductor structure as claimed in claim 1, wherein a thickness of any one of the first supporting layers is greater than a thickness of the first electrode or a thickness of the second electrode.

18. The micro semiconductor structure as claimed in claim 1, wherein a ratio of a contacting area between the first supporting layer and the region to an area of the region is greater than or equal to 0.1, and the ratio is smaller than or equal to 0.8.

19. The micro semiconductor structure as claimed in claim 1, wherein the substrate is a carrier substrate.

20. The micro semiconductor structure as claimed in claim 1, wherein the micro semiconductor devices are connected to the substrate only through the first supporting layers.

21. The micro semiconductor structure as claimed in claim 1, wherein the first supporting layers comprise an organic material.

22. The micro semiconductor structure as claimed in claim 1, wherein the first electrode and the second electrode are insulated from the substrate.

* * * * *